(12) United States Patent
Kim et al.

(10) Patent No.: US 11,982,822 B2
(45) Date of Patent: May 14, 2024

(54) DISPLAY DEVICE

(71) Applicant: LG Display Co., Ltd., Seoul (KR)

(72) Inventors: Youngmin Kim, Goyang-si (KR);
Juseong Park, Gimpo-si (KR);
Myung-Soo Park, Gimpo-si (KR);
Sewan Oh, Seoul (KR); Hoon Kang,
Goyang-si (KR); Dongyeon Kim, Seoul
(KR)

(73) Assignee: LG Display Co., Ltd., Seoul (KR)

( * ) Notice: Subject to any disclaimer, the term of this patent is extended or adjusted under 35 U.S.C. 154(b) by 251 days.

(21) Appl. No.: 17/467,097

(22) Filed: Sep. 3, 2021

(65) Prior Publication Data

US 2022/0206314 A1 Jun. 30, 2022

(30) Foreign Application Priority Data

Dec. 31, 2020 (KR) ........................ 10-2020-0189159

(51) Int. Cl.
*G02B 30/27* (2020.01)
*G02B 26/08* (2006.01)
*H10K 59/12* (2023.01)
*H10K 59/50* (2023.01)

(52) U.S. Cl.
CPC ............. *G02B 30/27* (2020.01); *G02B 26/08* (2013.01); *H10K 59/12* (2023.02); *H10K 59/50* (2023.02)

(58) Field of Classification Search
CPC ........ G02B 30/27; G02B 26/08; H10K 59/50; H10K 59/12
See application file for complete search history.

(56) References Cited

U.S. PATENT DOCUMENTS

| 2016/0021367 A1* | 1/2016 | Yoon ........................ G09G 3/03 348/59 |
| 2018/0059469 A1* | 3/2018 | Kim ......................... G02B 1/14 |

FOREIGN PATENT DOCUMENTS

KR 10-1921165 B1 11/2018

\* cited by examiner

*Primary Examiner* — Paisley L Wilson
*Assistant Examiner* — Agnes Dobrowolski
(74) *Attorney, Agent, or Firm* — Fenwick & West LLP

(57) ABSTRACT

A display device includes a display panel including a plurality of sub-pixel areas, and a light travel-direction changing layer including a plurality of light-transmitting patterns for changing the travel direction of light emitted from the plurality of sub-pixel areas, respectively. In this connection, a central point of a light-emission face of each of the plurality of light-transmitting patterns is defined as a point at which a virtual face corresponding to the light-emission face of each of the plurality of light-transmitting patterns contacts an optimal light-path line connecting a sub-pixel area corresponding to each light-transmitting pattern and a central point of the viewing area to each other. In this way, light from the sub-pixel area may pass through the light-transmitting pattern and may be directed toward the central point of the viewing area. Thus, the display quality in the viewing area may be improved.

16 Claims, 17 Drawing Sheets

DISPLAY DEVICE

CROSS-REFERENCE TO RELATED APPLICATION

The present disclosure claims priority to and the benefit of Korean Patent Application No. 10-2020-0189159, filed on Dec. 31, 2020, the disclosure of which is incorporated herein by reference in its entirety.

BACKGROUND

Field

The present disclosure relates to a display device for displaying an image.

Description of Related Art

Display devices are widely used for image display functions of various electronic devices such as mobile communication terminals, electronic notebooks, e-books, PMPs (Portable Multimedia Players), navigation systems, UMPCs (Ultra Mobile PCs), mobile phones, smart phones, tablet PCs (personal computers), watch phones, electronic pads, wearable devices, portable information devices, vehicle control display devices, televisions, notebook computers, and monitors. Research to improve thinness, to reduce weight, and to lower power consumption of such a display device and an electronic product having the same is continuing.

Examples of display devices include a liquid crystal display device (LCD), a plasma display device (PDP), a field emission display device (FED), an electro-wetting display device (EWD), and an electroluminescent display device (ELDD), and the like.

The display device may be flexible and may be deformed into various forms different from a planar shape.

Moreover, the display device may display a 3D stereoscopic image using a stereography scheme. The stereography scheme refer to a three-dimensional image display scheme in which different combined images based on parallax information corresponding to a spacing (about 65 mm) between a left-eye and a right-eye of a viewer are respectively provided to the left-eye and the right-eye such that the viewer recognizes a three-dimensional image via a combination of the combined images.

The stereography scheme may include an autostereoscopic scheme which does not use glasses. In this autostereoscopic scheme, a left-eye image and a right-eye image are separated from each other using a parallax barrier or a lenticular lens disposed between a light-emitting display panel and the viewer. That is, in the autostereoscopic scheme, a luminance distribution of the image visible to the viewer may vary according to a position of the viewer, so that different images may be visible to the left-eye and the right-eye, and thus the viewer may perceive a stereoscopic image.

In a lenticular lens scheme, the display panel includes left-eye pixel areas to display a left-eye image and right-eye pixel areas to display a right-eye image. Light from the left-eye pixel area and light from the right-eye pixel area are positioned on a focal plane of the lenticular lens, such that the left-eye image and the right-eye image may be provided based on directivity characteristics of the lenticular lens.

SUMMARY

In a planar shaped display device, an entire planar display area faces a predefined viewing area. Thus, most of the light beams from the display area may be emitted toward the viewing area. That is, a light beam directed toward the viewing area among the light beams from the display area may have relatively high luminance.

However, in a display device having a display face of a shape different from the planar shape, at least a portion of the display area including at least one curved area may not face the viewing area. Therefore, light beams emitted from a portion of the display area that does not face the predefined viewing area and directed toward the viewing area may have relatively low luminance. Thus, display quality in the viewing area may be deteriorated.

In particular, when the display device has an outwardly-bent shape that is convexly curved toward the viewing area, light emitted from both opposing edge areas of the outwardly-bent shaped display area may not travel toward the viewing area. Thus, the display quality in the viewing area may be further deteriorated.

In addition, in a display device including an lenticular lens to provide a 3D image display function, light from each sub-pixel area may be incident not only to one target lenticular lens corresponding to each sub-pixel area, but also to a non-target lenticular lens disposed around the target lenticular lens. In this case, an overlapping image viewing area in which the image is displayed in an overlapping manner due to the light directed by the non-target lenticular lens may occur. Thus, the display quality of the 3D image may be deteriorated.

Thus, a purpose of the present disclosure is to provide a display device that may improve display quality in a viewing area even when a display face thereof is deformed into a shape different from a planar shape.

Another purpose of the present disclosure is to provide a display device capable of improving a display quality in a viewing area even when a display face thereof includes an outwardly-bent shape.

Still another purpose of the present disclosure is to provide a display device that may reduce occurrence of an overlapping image viewing area.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

A display device according to an example of the present disclosure includes a display panel including a plurality of sub-pixel areas, and a light travel-direction changing layer including a plurality of light-transmitting patterns for changing the travel direction of light emitted from the plurality of sub-pixel areas, respectively.

In this connection, a central point of a light-emission face of each of the plurality of light-transmitting patterns is defined as a point at which a virtual face corresponding to the light-emission face of each of the plurality of light-transmitting patterns contacts an optimal light-path line connecting a sub-pixel area corresponding to each light-transmitting pattern and a central point of the viewing area to each other.

In this way, light from the sub-pixel area may pass through the light-transmitting pattern and may be directed toward the central point of the viewing area. Thus, the display quality in the viewing area may be improved.

Each of the display panel and the light travel-direction changing layer may have a bent shape. Even in this case, the central point of the light-emission face of each of the plurality of light-transmitting patterns is positioned at a position corresponding to the optimal light-path line of the sub-pixel area corresponding to each light-transmitting pattern. Thus, deterioration of the display quality in the viewing area due to the bent shape may be prevented.

The display device may further include a lens array disposed on the light travel-direction changing layer, wherein the lens array includes a plurality of lenticular lenses arranged in a matrix form.

In this case, the light travel-direction changing layer may allow the light from each sub-pixel area to be directed toward the target lenticular lens, thereby reducing the overlapping image viewing area.

According to one embodiment of the present disclosure, the light travel-direction changing layer for changing the travel direction of light emitted from each of the plurality of sub-pixel areas based on a predefined viewing area is disposed on the display panel. The light travel-direction changing layer includes the plurality of light-transmitting patterns corresponding to the plurality of sub-pixel areas. In this connection, the central point of the light-emission face of each of the plurality of light-transmitting patterns is defined as a point at which the virtual face corresponding to the light-emission face of each of the plurality of light-transmitting patterns contacts the optimal light-path line connecting a sub-pixel area corresponding to each light-transmitting pattern and the central point of the viewing area to each other.

Thus, each of the plurality of light-transmitting patterns is positioned in the optimal light-path line between each of the plurality of sub-pixel areas and the central point of the viewing area. Thus, regardless of the shape of the display device, the light from each sub-pixel area as directed toward the viewing area may emit through each light-transmitting pattern. Therefore, the display quality in the viewing area may be prevented from deteriorating due to the shape of the display device including at least one curved display face.

In particular, even when the display device has an outwardly-bent shape, the light emitting from each sub-pixel area and facing toward the viewing area may emit through each light-transmitting pattern, regardless of the position of the sub-pixel area. Thus, the deterioration of the display quality in the viewing area may be prevented.

In addition, since a path along which light from each sub-pixel area emits is controlled by each light-transmitting pattern, the light may be prevented from being incident onto a non-target lenticular lens. This may reduce the overlapping image viewing area, such that the display quality of the 3D image may be improved.

Effects of the present disclosure are not limited to the above-mentioned effects, and other effects as not mentioned will be clearly understood by those skilled in the art from following descriptions.

DETAILED DESCRIPTIONS

Figure 1:
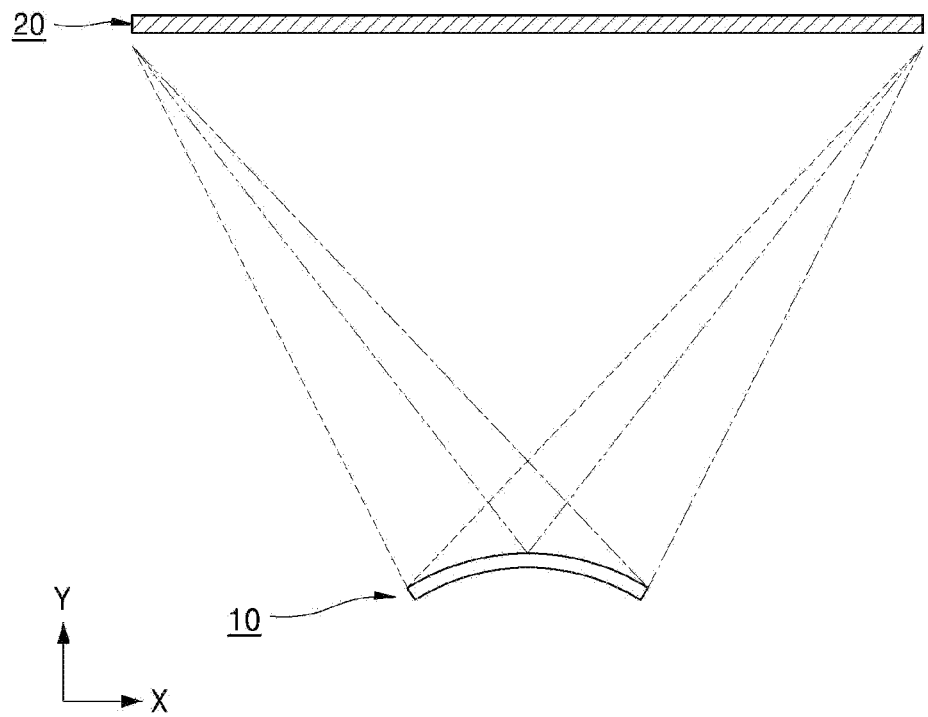
FIG. 1 is a schematic diagram of a display device and a viewing area.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

"X axis direction", "Y axis direction" and "Z axis direction" should not be interpreted only to have a geometric relationship in which the X axis direction, the Y axis direction, and the Z axis direction are perpendicular to each other. "X axis direction", "Y axis direction" and "Z axis direction" may be interpreted to have a broader direction within a range in which components herein may work functionally.

Hereinafter, a display device according to one embodiment of the present disclosure and an electronic device having the same will be described with reference to the attached drawing.

FIG. 1 is a schematic diagram of a display device and a viewing area.

As shown in FIG. 1, a display device 10 according to one embodiment of the present disclosure has a display face of a shape different from a planar shape.

In one example, as shown in FIG. 1, the display device 10 has a display face of a bent shape that is convexly curved toward an area 20 (hereinafter, referred to as "viewing area") where a viewer viewing an image from the display device 10 is located. That is, the display face may have an outwardly-bent shape.

However, this is only an example. The display device 10 according to one embodiment of the present disclosure may have a display face of a bent shape that is concavely curved toward the viewing area 20, that is, an inwardly-bent shape. Alternatively, the display device 10 according to one embodiment of the present disclosure may have a display face of a shape including both of at least one of an outwardly-bent shape and an inwardly-bent shape, and a planar shape.

Regardless of the shape of the display face of the display device 10, in order to ensure the display quality in the viewing area 20, light from the display device 10 needs to be emitted toward the viewing area 20.

That is, as indicated by a dash-double dotted line in FIG. 1, light emitted from a midpoint of the display device 10 is directed toward the viewing area 20.

Likewise, as shown by a dash-single dotted line and a long-dashed line in FIG. 1, light emitted from both opposing edges of the display device 10 is directed toward the viewing area 20.

In this way, an entire display face of the display device 10 may be visually recognized by the viewer at all of points of the viewing area 20.

However, as shown in FIG. 1, when the display device 10 includes a display face of an outwardly-bent shape, one of both opposing edges of the display face may face one side and a center of the viewing area 20, but may not face the opposite side of the viewing area 20. Accordingly, a size of the viewing area 20 may be reduced, or the display quality in the viewing area 20 may be deteriorated.

Accordingly, one embodiment of the present disclosure provides a display device 10 capable of preventing the display quality degradation in the viewing area 20 due to a deformation of the shape of the display face.

Figure 2:
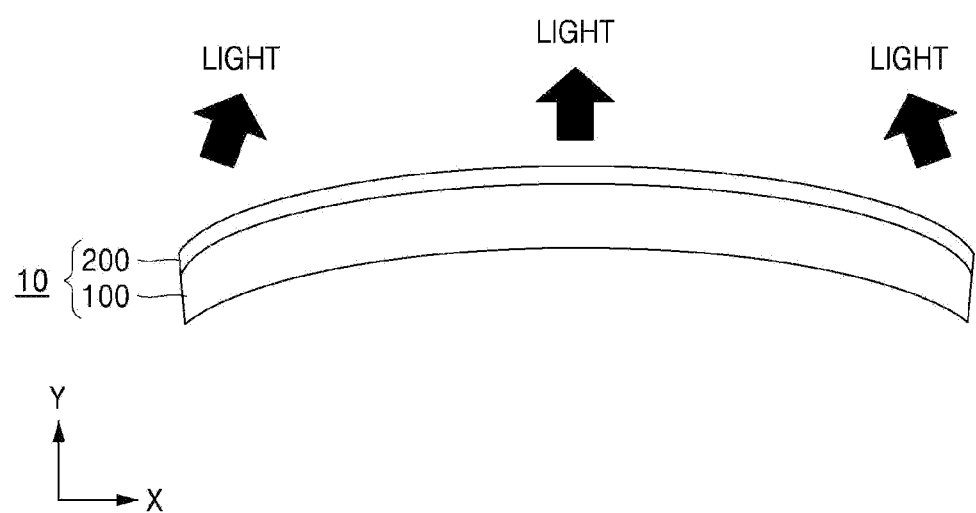
FIG. 2 is a drawing showing a display device according to one embodiment of the present disclosure.
Figure 3:
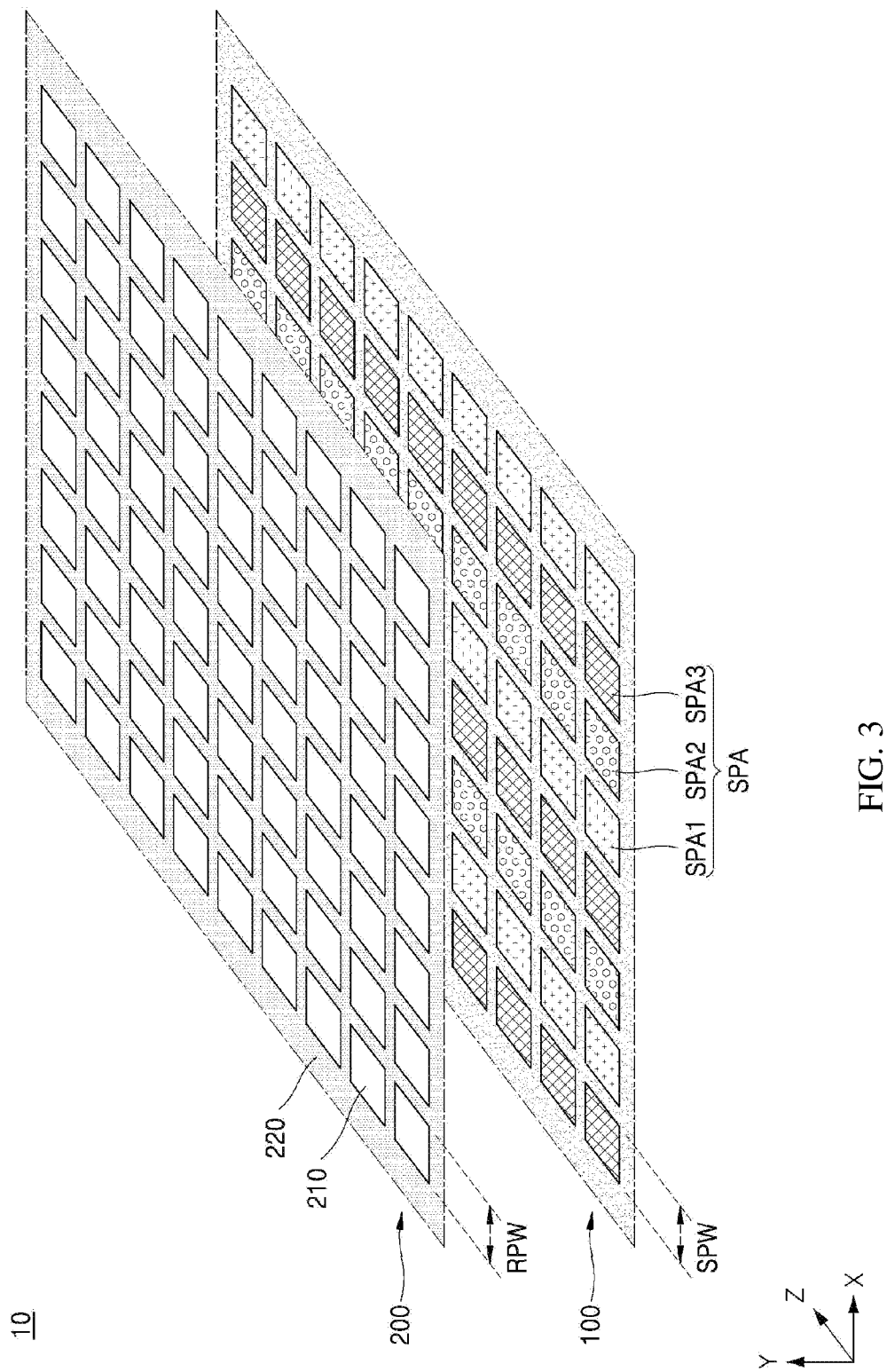
FIG. 3 is a drawing showing a display panel and a light travel-direction changing layer as components of the display device in FIG. 2.

FIG. 2 is a cross-sectional view showing a display device according to one embodiment of the present disclosure. FIG. 3 is a drawing showing a display panel and a light travel-direction changing layer as components of the display device in FIG. 2.

As shown in FIG. 2, the display device 10 according to one embodiment of the present disclosure includes a display panel 100 which emits light LIGHT for displaying the image, and a light travel-direction changing layer 200 which is disposed on the display panel, and changes the travel direction of the light from the display panel based on the viewing area (20 in FIG. 1).

As shown in FIG. 3, the display device 10 according to one embodiment of the present disclosure includes the display panel 100 including a plurality of sub-pixel areas SPA that are arranged in a matrix form and output light for displaying an image, and a light travel-direction changing layer 200 disposed on the display panel 100 for changing the travel direction of light emitted from each of the plurality of sub-pixel areas SPA based on a predefined viewing area (20 in FIG. 1).

The display panel 100 includes a display area (AA in FIG. 7) where the image display is implemented, and includes a plurality of sub-pixel areas SPA arranged in a matrix form and in the display area AA. Each sub-pixel area SPA emits light at a luminance level corresponding to the image.

When the display panel 100 displays a color image, each of the plurality of sub-pixel areas SPA emits light in a wavelength range corresponding to one color among a plurality of different colors. In this connection, the plurality of colors may include red, green, and blue. That is, the plurality of sub-pixel areas SPA may include a first sub-pixel area SPA1 corresponding to red, a second sub-pixel area SPA2 corresponding to green, and a third sub-pixel area SPAS corresponding to blue. Alternatively, the plurality of colors may further include white. To this end, the display panel 100 may include a color filter (not shown).

The light travel-direction changing layer 200 may include a plurality of light-transmitting patterns 210 respectively corresponding to a plurality of sub-pixel areas SPA and arranged in a matrix form, and a light-blocking pattern 220 disposed between the plurality of light-transmitting patterns 210.

The travel direction of light from each sub-pixel area SPA may vary to face toward the viewing area 20 while passing through each light-transmitting pattern 210 corresponding to each sub-pixel area SPA.

Alternatively, the display device 10 may provide a function of displaying a 3D stereoscopic image.

Figure 4:
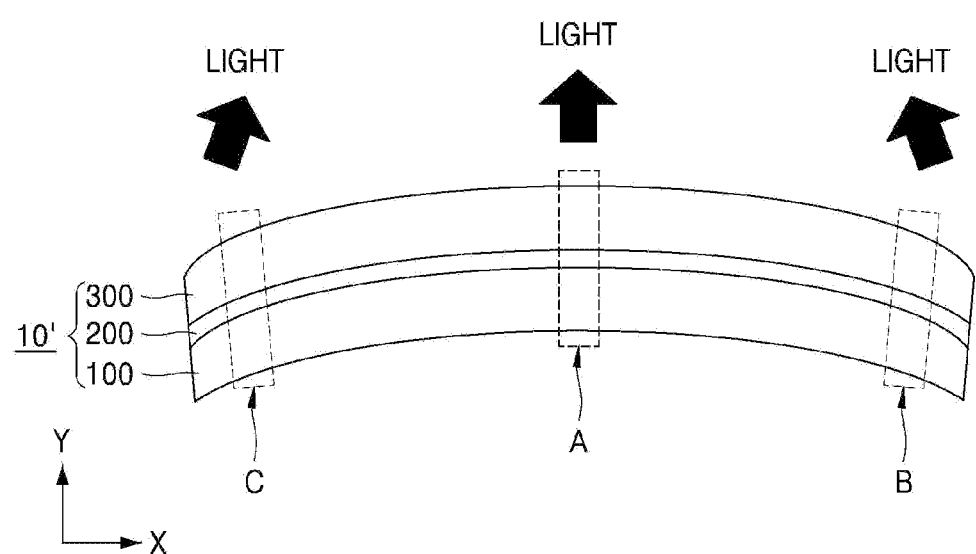
FIG. 4 is a drawing showing a display device according to another embodiment of the present disclosure.
Figure 5:
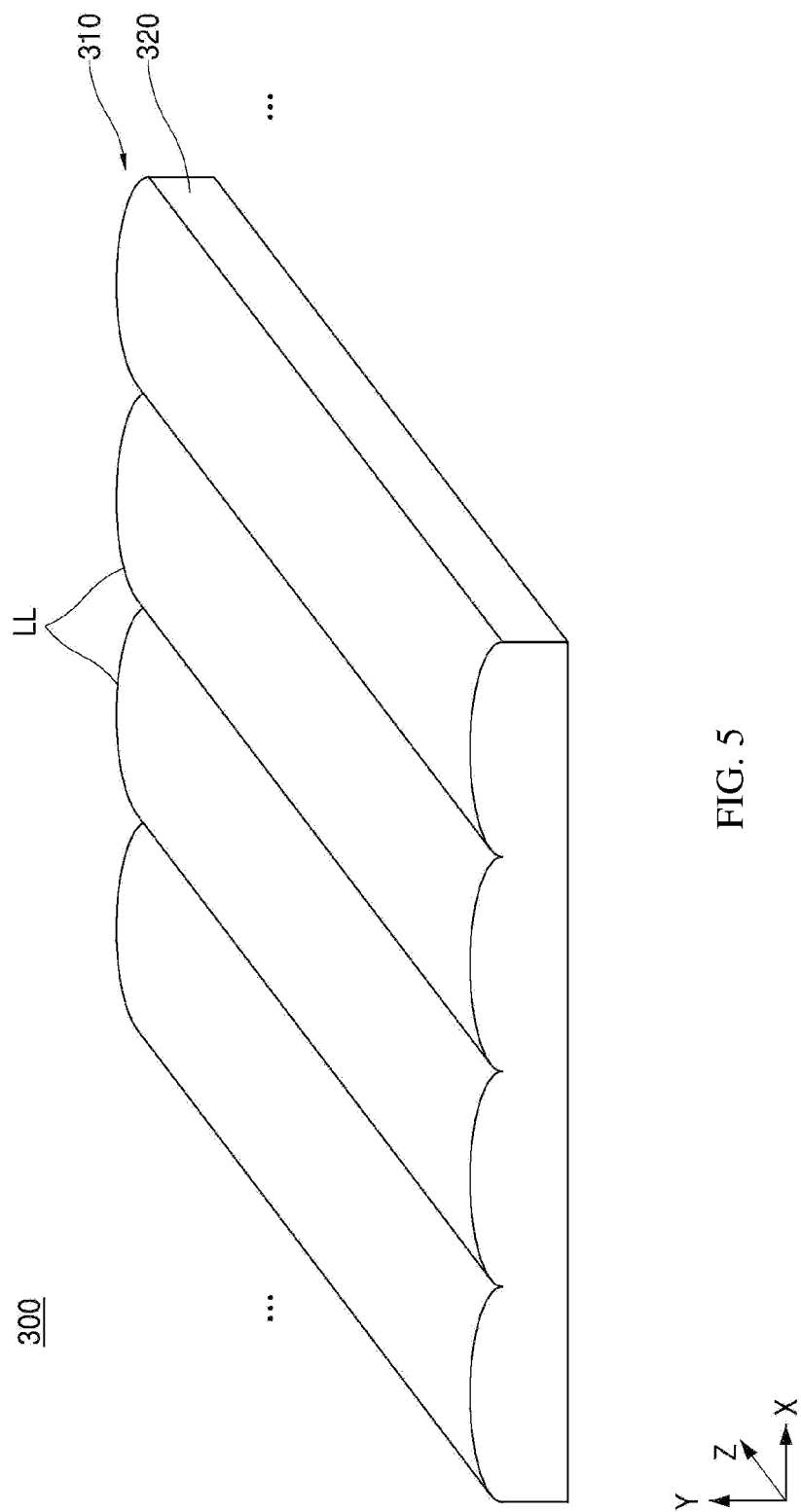
FIG. 5 is a drawing showing a lens array in FIG. 4.
Figure 6:
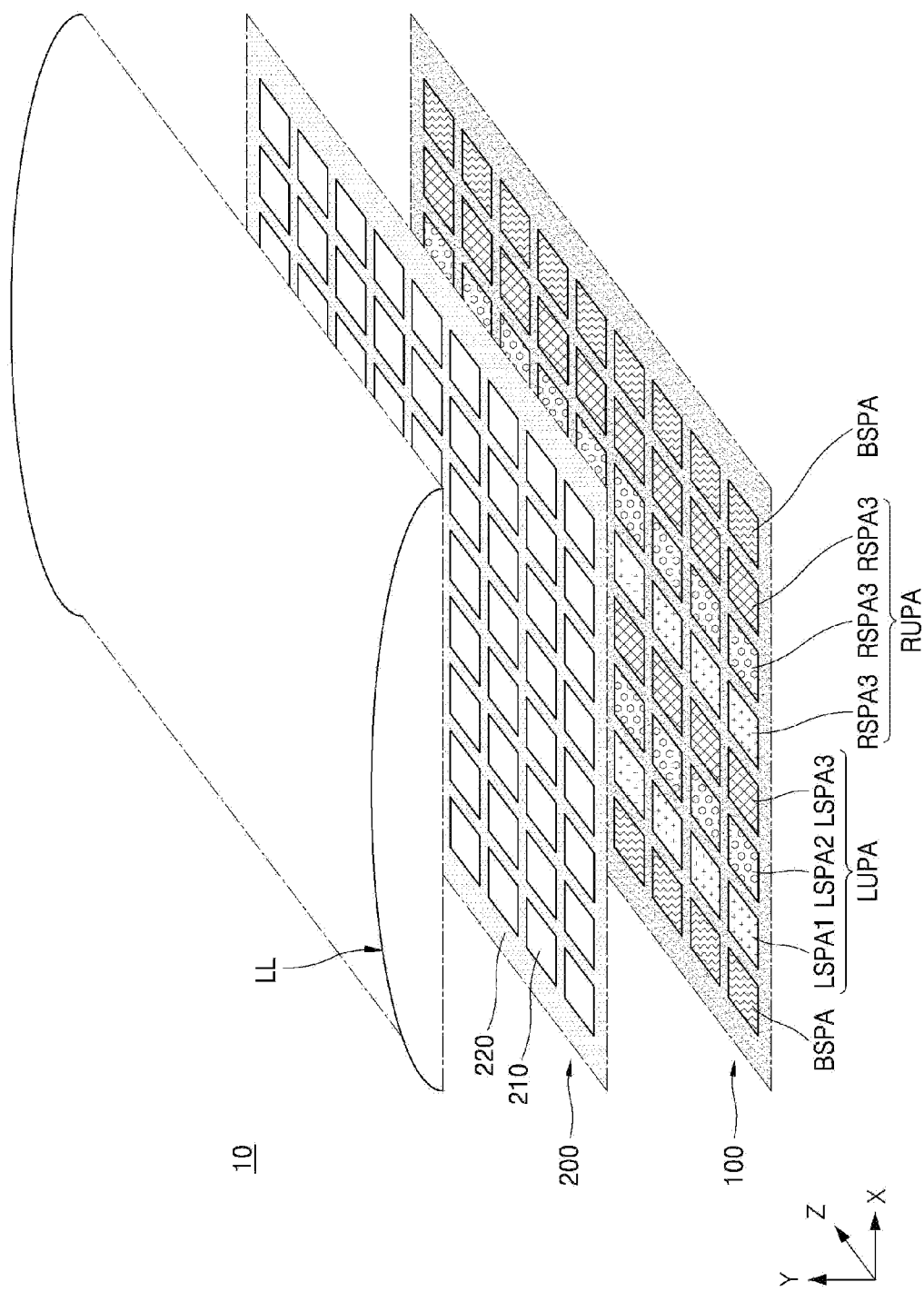
FIG. 6 is a drawing showing a display panel, a light travel-direction changing layer, and a lens array as components of the display device in FIG. 4.

FIG. 4 is a drawing showing a display device according to another embodiment of the present disclosure. FIG. 5 is a drawing showing a lens array in FIG. 4. FIG. 6 is a drawing showing a display panel, a light travel-direction changing layer, and a lens array as components of the display device in FIG. 4.

As shown in FIG. 4, a display device 10' according to another embodiment of the present disclosure is the same as that in one embodiment as shown in FIG. 2, except that the display device 10' further includes a lens array 300 disposed on the light travel-direction changing layer 200. Hereinafter, duplicate descriptions therebetween are omitted.

As shown in FIG. 5, the lens array 300 of the display device 10' according to another embodiment of the present disclosure includes a lens layer 310 composed of a plurality of lenticular lenses LL arranged in a matrix form, and a spacer layer 320 to space the lens layer 310 and the light travel-direction changing layer 200 from each other.

The lens array 300 separates a left-eye image and a right-eye image from the display panel 100 from each other. As shown in FIG. 6, the display panel 100 may include left-eye image sub-pixel areas LSPA1, LSPA2, and LSPA3 that emit light of a left-eye image, and right-eye image sub-pixel areas RSPA1, RSPA2, and RSPA3 that emit light of a right-eye image. First, second and third left-eye image sub-pixel areas LSPA1, LSPA2, and LSPA3 that are adjacent to each other and correspond to different colors among the left-eye image sub-pixel areas may constitute a left-eye image unit pixel area LUPA as a basic color unit of the left-eye image. Similarly, first, second and third right-eye image sub-pixel areas RSPA1, RSPA2, and RSPA3 that are adjacent to each other and correspond to different colors among the right-eye image sub-pixel areas may constitute a right-eye image unit pixel area RUPA as a basic color unit of the right-eye image.

Each lenticular lens LL of the lens array 300 may correspond to at least one left-eye image unit pixel area LUPA, at least one right-eye image unit pixel area RUPA, and at least one black sub-pixel area BSPA corresponding to each of both opposing edges of the lens LL. Accordingly, the left-eye image unit pixel area LUPA and the right-eye image unit pixel area RUPA may be separated from each other according to the directivity characteristics of the lenticular lens LL.

Due to the black sub-pixel area BSPA corresponding to the edge of each lenticular lens LL, distortion caused by the edge of each lenticular lens LL may be prevented.

In addition, according to another embodiment of the present disclosure, the light travel-direction changing layer 200 disposed between the display panel 100 and the lens array 300 may prevent light from each sub-pixel area (LSPA1, LSPA2, LSPA3, RSPA1, RSPA2, and RSPA3) from being incident to a non-target lenticular lens other than a target lenticular lens LL corresponding to each sub-pixel area. As a result, a size of the overlapping image viewing area may be reduced.

Figure 7:
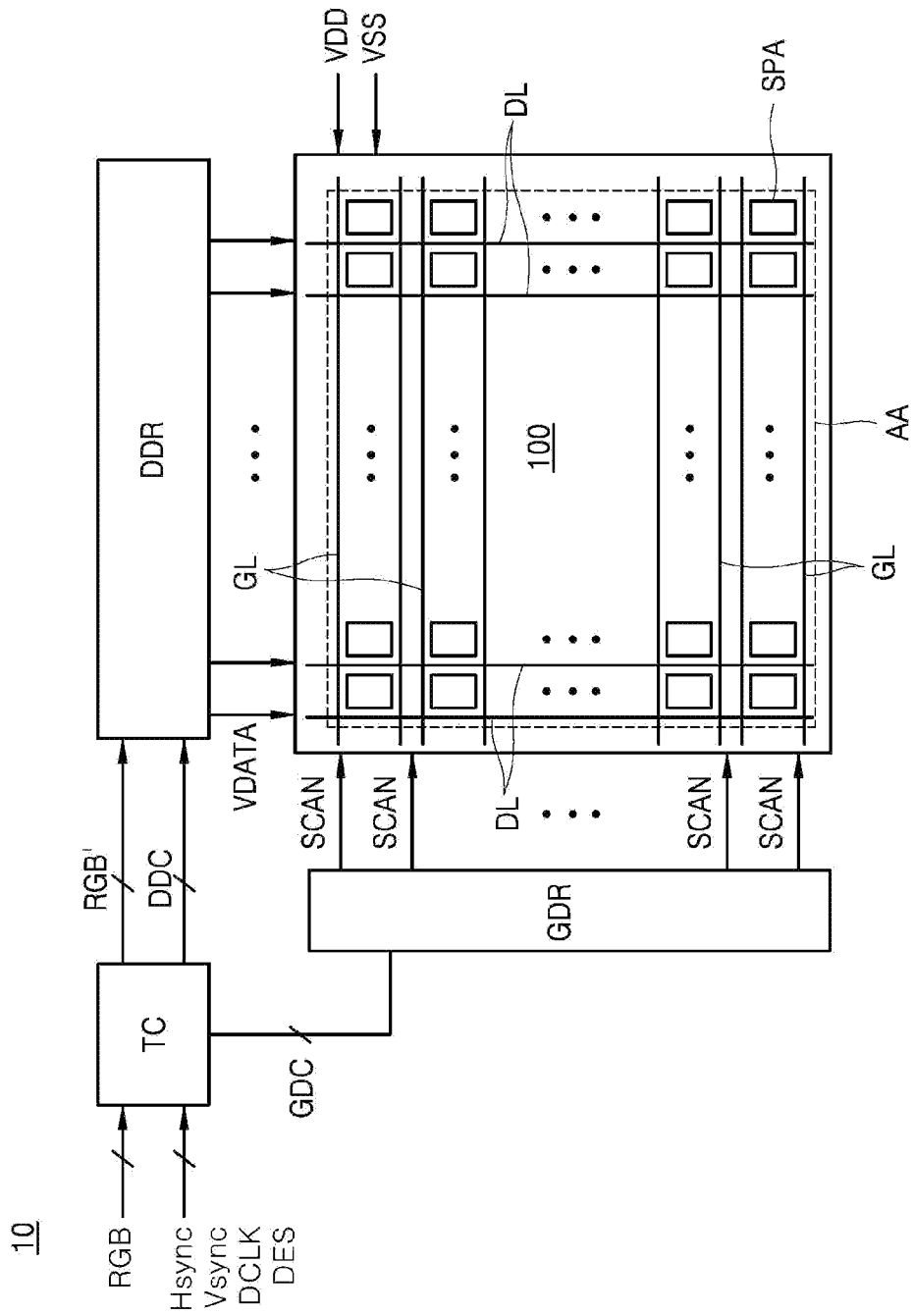
FIG. 7 is a drawing showing the display panel of FIGS. 2 and 4.
Figure 8:
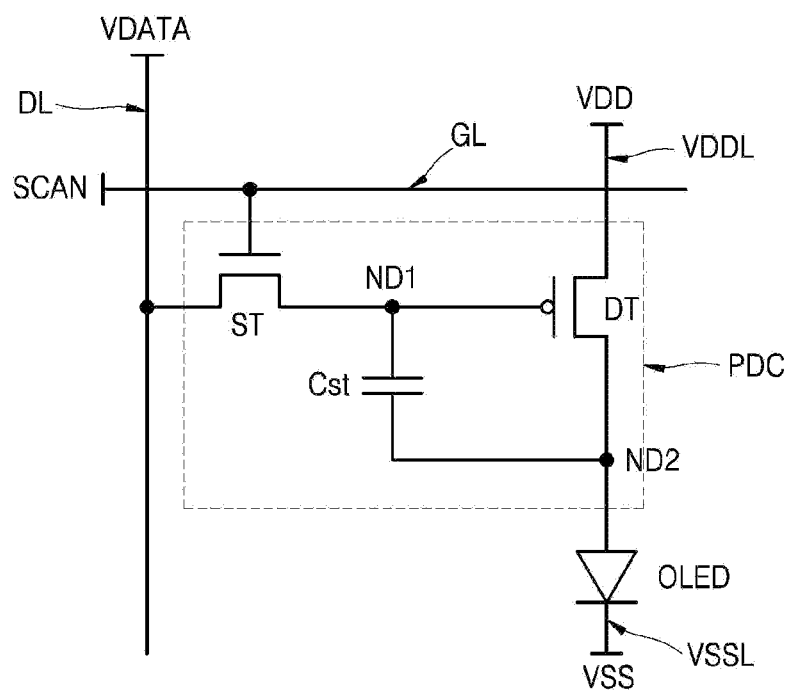
FIG. 8 is a drawing showing an example of an equivalent circuit corresponding to a sub-pixel area of FIG. 7.
Figure 9:
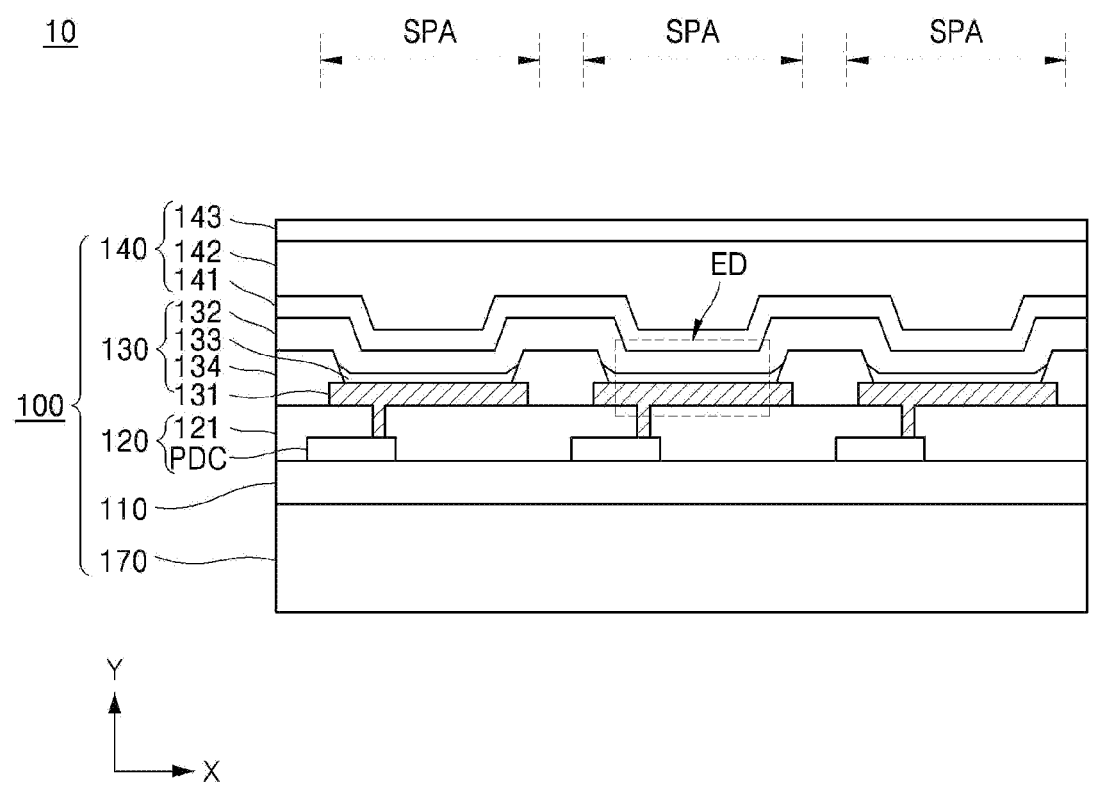
FIG. 9 is a drawing showing an example of a portion of a display panel in FIG. 7.

FIG. 7 is a drawing showing the display panel of FIGS. 2 and 4. FIG. 8 is a drawing showing an example of an equivalent circuit corresponding to the sub-pixel area of FIG. 7. FIG. 9 is a drawing showing an example of a portion of the display panel in FIG. 7.

As shown in FIG. 7, the display panel 100 includes a display area AA in which an image display is implemented, a plurality of sub-pixel areas SPA arranged in the display area AA, and signal lines GL and DL connected to the plurality of sub-pixel areas SPA. The signal lines GL and DL of the display panel 100 may transmit a drive signal supplied from a panel driver TC, GDR, and DDR to each sub-pixel area SPA.

The signal lines GL and DL of the display panel 100 may include a gate line GL transmitting a scan signal SCAN of the gate driver GDR, and a data line DL transmitting a data signal VDATA of the data driver DDR.

When the display panel 100 includes a light-emissive element (not shown) corresponding to each sub-pixel area SPA, the display panel 100 may further include first and second driving power lines for respectively transmitting first and second driving powers VDD and VSS for the operation of the light-emissive element.

The panel driver TC, GDR, and DDR may include the gate driver GDR connected to the gate line GL of display panel 100, the data driver DDR connected to the data line DL of the display panel 100, and a timing controller TC for controlling an operation timing of each of the gate driver GDR and the data driver DDR.

The timing controller TC rearranges digital video data RGB input from an external system based on a resolution of the display panel 100, and supplies the rearranged digital video data RGB' to the data driver DDR.

The timing controller TC may generate and supply a data control signal DDC to control the operation timing of the data driver DDR, and a gate control signal GDC to control the operation timing of the gate driver GDR, based on timing signals such as a vertical synchronization signal Vsync, a horizontal synchronization signal Hsync, a dot clock signal DCLK, and a data enable signal DE.

The gate driver GDR sequentially supplies a scan signal SCAN to a plurality of gate lines GLs during one frame period for displaying an image based on the gate control signal GDC. That is, the gate driver GDR supplies a scan signal SCAN to each gate line GL during each horizontal period corresponding to each gate line GL during one frame period. In this connection, the gate line GL may correspond to sub-pixel areas SPA arranged in a line in a horizontal direction among the plurality of sub-pixel areas SPA.

The data driver DDR converts the rearranged digital video data RGB' into an analog data voltage based on the data control signal DDC. The data driver DDR supplies, to the data line DL, a data signal VDATA corresponding to each of the sub-pixel areas SPA corresponding to each gate line GL during each horizontal period based on the rearranged digital video data RGB'.

As shown in FIG. 8, each sub-pixel area SPA includes a light-emissive element OLED, and a pixel driver circuit PDC for supplying a drive signal to the light-emissive element OLED.

In one example, the pixel driver circuit PDC includes a driving transistor DT, a switching transistor ST, and a storage capacitor Cst.

In addition, although not shown in FIG. 8, each sub-pixel area SPA may further include a compensation circuit (not shown) for compensating for deterioration of at least one of the driving transistor DT and the light-emissive element OLED. The compensation circuit may include at least one transistor (not shown) to detect a deterioration amount or to supply a reference power (not shown).

The driving transistor DT may be connected in series to the light-emissive element OLED and may be disposed between a first driving power line VDDL supplying a first driving power VDD and a second driving power line VSSL supplying a second driving power VSS with a lower potential than that of the first driving power VDD.

That is, one end of the driving transistor DT is connected to the first driving power line VDDL, while the opposite end of the driving transistor DT is connected to one end of the light-emissive element OLED. Moreover, the opposite end of the light-emissive element OLED is connected to the second driving power line VSSL.

The switching transistor ST is disposed between a first node ND1 and the data line DL supplying the data signal VDATA of each sub-pixel area SPA. The first node ND1 is a contact point between a gate electrode of the driving transistor DT and the switching transistor ST. Moreover, a gate electrode of the switching transistor ST is connected to the gate line GL.

The storage capacitor Cst is disposed between the first node ND1 and a second node ND2. The second node ND2 is a contact point between the driving transistor DT and the light-emissive element OLED.

An operation of this pixel driver circuit PDC is as follows.

The switching transistor ST is turned on based on the scan signal SCAN of the gate line GL. In this connection, the data signal VDATA of the data line DL is supplied to the gate electrode of the driving transistor DT and the storage capacitor Cst via the turned-on switching transistor ST and the first node ND1.

The storage capacitor Cst is charged with the data signal VDATA.

Moreover, the driving transistor DT is turned on based on the data signal VDATA and the charged voltage of the storage capacitor Cst to generate a drive current corresponding to the data signal VDATA. Accordingly, the drive current resulting from the turned-on driving transistor DT may be supplied to the light-emissive element OLED.

As shown in FIG. 9, the display panel 100 may include a support substrate 110, a transistor array 120 disposed on the support substrate 110, a light-emitting array 130 disposed on the transistor array 120, and A sealing film 140 disposed on the light-emitting array 130.

The support substrate 110 may be made of a flexible insulating material. In one example, the support substrate 110 may be made of one of PI (polyimide), PC (polycarbonate), PET (polyethyleneterephthalate), PMP (polymethylpentene), PMMA (polymethylmethacrylate), PNB (polynorbornene), PEN (polyethylenapthanate), PES (polyethersulfone), and COS (cycloolefin copolymer).

The transistor array 120 includes a pixel driver circuit (PDC of FIG. 8) corresponding to each of the plurality of sub-pixel areas SPA. As shown in FIG. 8, the pixel driver circuit PDC may include the driving transistor DT connected to the light-emissive element OLED, the switching transistor ST which is turned on and off based on the scan signal of the gate line GL and delivers the data signal VDATA of the data line DL to the gate electrode of the driving transistor DT, and the storage capacitor Cst connected to the gate electrode of the driving transistor DT. The transistor array 120 further includes signal lines GL and DL connected to the pixel driver circuit PDC of each sub-pixel area SPC.

The transistor array 120 may further include a planarization film 121 disposed on the support substrate 110 and covering the pixel driver circuit PDC in a planarized manner.

The light-emissive array 130 may be disposed on the planarization film 121 of the transistor array 120.

The light-emissive array 130 may include a light-emissive element ED (OLED in FIG. 8) corresponding to each of the plurality of sub-pixel areas SPA.

Each light-emissive element ED may include a first electrode 131 and a second electrode 132 facing away each other, and a light-emissive structure 133 disposed therebetween.

In one example, the light-emitting array 130 may include the first electrode 131 disposed on the planarization film 121 and corresponding to each sub-pixel area SPA, a bank 134 which is disposed on the planarization film 121, corresponds to an outer edge of each sub-pixel area SPA, and covers an edge of the first electrode 131, a light-emissive structure 133 disposed on the first electrode 131, and the second electrode 132 disposed on the bank 134 and the light-emissive structure 133.

The sealing film 140 is disposed on the light-emitting array 130 to seal the light-emitting array 130.

The sealing film 140 may have a structure in which a plurality of protective films 141, 142, and 143 made of different insulating materials or having different thicknesses are sequentially stacked.

In one example, the plurality of protective films 141, 142, and 143 may include a first protective film 141 which covers the second electrode 132 and is made of an inorganic insulating material, a second protective film 141 disposed on the first protective film 141 in a planarized manner and made of an organic insulating material, and a third protective film 143 disposed on the second protective film 142 and made of an inorganic insulating material.

This sealing film 140 may delay invasion of moisture or oxygen into the light-emitting array 130. Thus, influence of foreign material thereon may be reduced.

An auxiliary substrate 170 may be intended for reinforcing the support substrate 110 and may be omitted depending on a material of the support substrate 110.

In one example, as shown in FIG. 2 and FIG. 4, each of the display devices 10 and 10' according to the embodiments of the present disclosure may include the light travel-direction changing layer 200 to change a direction in which light from each sub-pixel area SPA provided in the display panel 100 emits. That is, the light travel-direction changing layer 200 includes the plurality of light-transmitting patterns 210 respectively corresponding to the plurality of sub-pixel areas SPA. Each light-transmitting pattern 210 adjusts the direction in which light of each sub-pixel area SPA emits based on the viewing area 20.

To this end, a light-emission face of each light-transmitting pattern 210 corresponds to an optimal light-path line corresponding to each sub-pixel area SPA and corresponding to the viewing area 20.

In other words, an inclination of the optimal light-path line corresponding to each sub-pixel area SPA may vary based on a position of each sub-pixel area SPA in the display panel 100. Therefore, a position of the light-emission face of each light-transmitting pattern 210 corresponding to each sub-pixel area SPA is also adjusted based on the position of each sub-pixel area SPA.

In one example, as shown in FIG. 2 and FIG. 4, when the display device 10 has the display face of an outwardly-bent shape, each sub-pixel area SPA disposed in a center region around a central point of the display panel 100 faces toward a central point of the viewing area 20. Thus, the light-emission face of each light-transmitting pattern 210 is normal to a direction in which light of each sub-pixel area SPA emits, and is relatively parallel to each sub-pixel area SPA.

Figure 10:
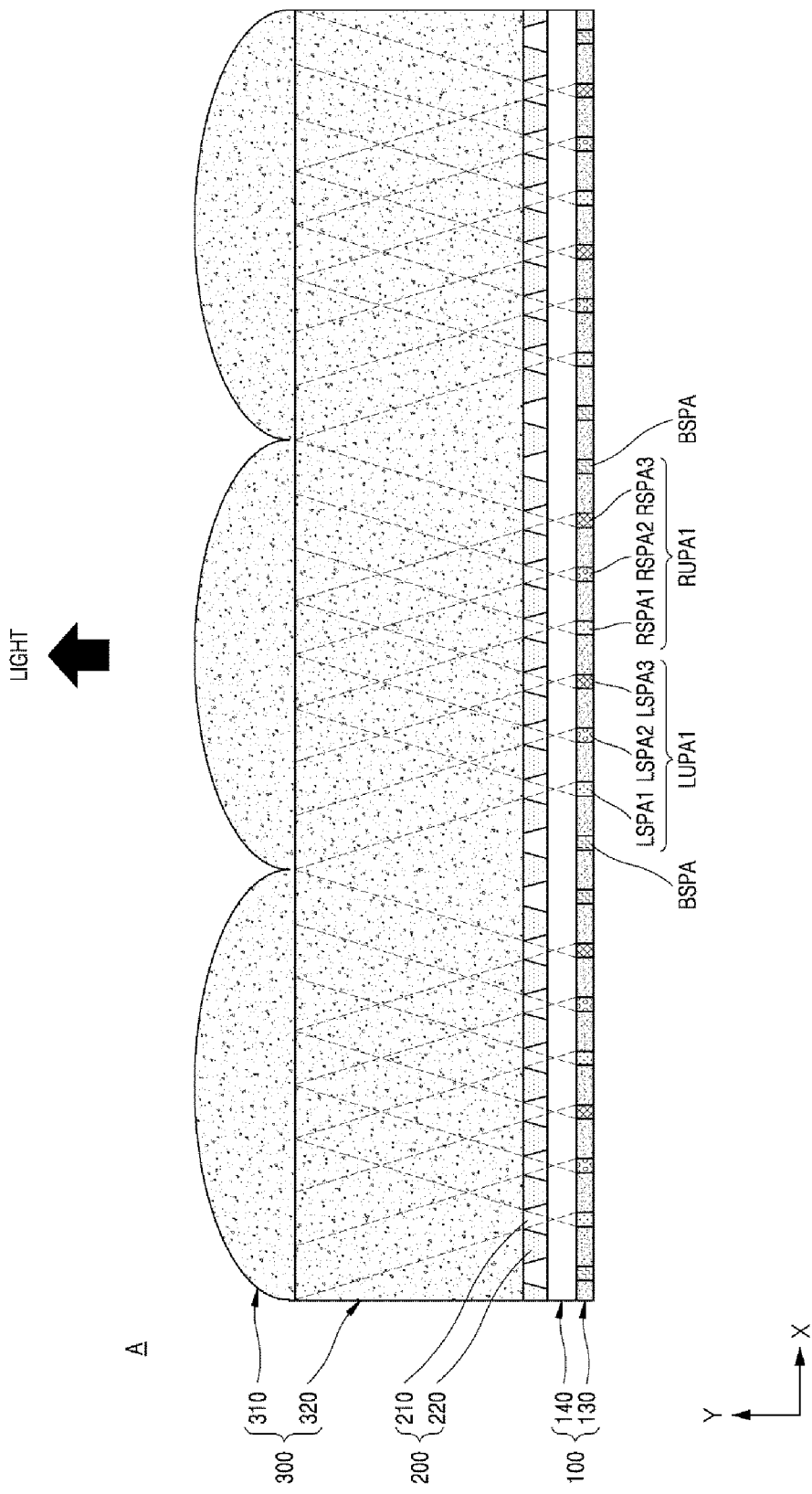
FIG. 10 is a schematic diagram showing a light-emission area of each sub-pixel area corresponding to an A portion in FIG. 4.

FIG. 10 is a schematic diagram showing a light-emission area of each sub-pixel area corresponding to an A portion in FIG. 4.

As shown in FIG. 4 and FIG. 10, in the outwardly-bent shaped display device 10, the light-emission direction from each sub-pixel area SPA disposed in the center region of the display panel 100 faces toward the central point of the viewing area 20. Therefore, the light-emission faces of each light-transmitting pattern 210 is parallel to each sub-pixel area SPA while is normal to the light-emission direction from each sub-pixel area SPA.

To the contrary, each sub-pixel area SPA in each of both opposing edge portions of the outwardly-bent shaped display device 10 does not face toward the central point of the viewing area 20. Therefore, in each of both opposing edge portions of the display device 10, each light-transmitting pattern 210 changes the travel direction of light from each sub-pixel area SPA to be directed to the central point of the viewing area 20. To this end, in each of both opposing edge portions of display device 10, the light-emission face of each light-transmitting pattern 210 is not parallel to each sub-pixel area SPA and is not normal to the direction in which light of each sub-pixel area SPA emits.

Figure 11:
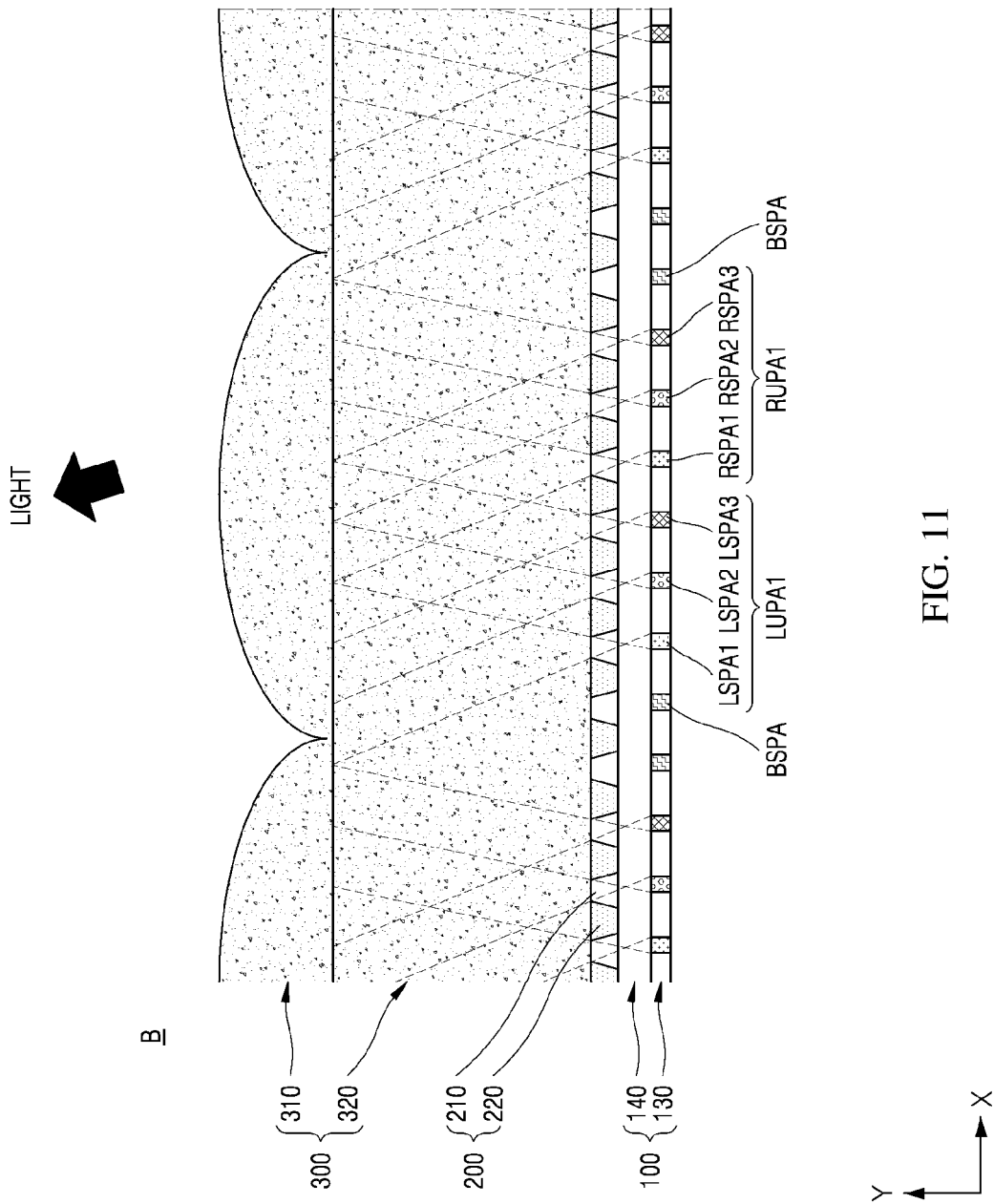
FIG. 11 is a schematic diagram showing a light-emission area of each sub-pixel area corresponding to a B portion of FIG. 4.
Figure 12:
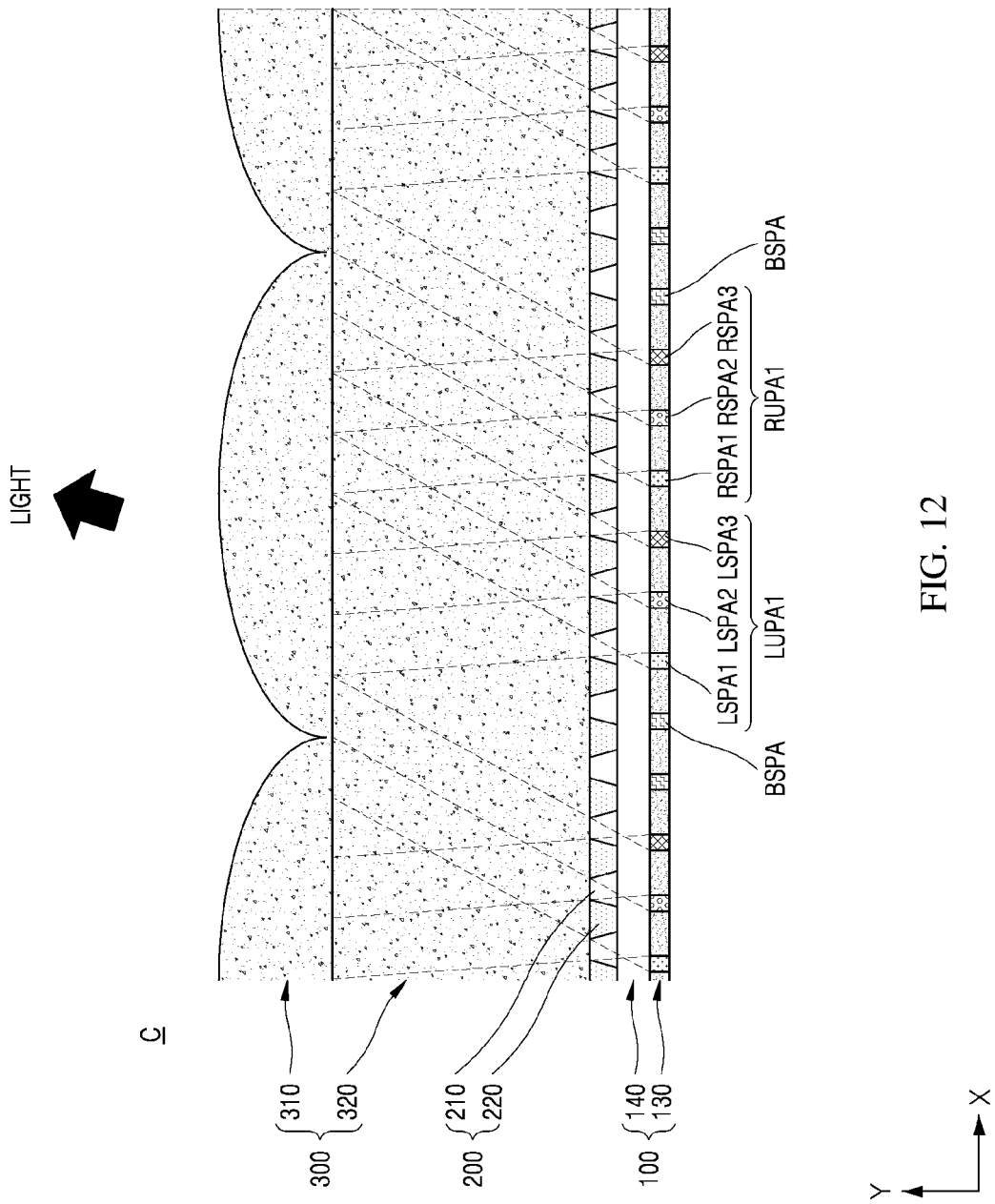
FIG. 12 is a schematic diagram showing a light-emission area of each sub-pixel area corresponding to a C portion in FIG. 4.

FIG. 11 is a schematic diagram showing a light-emission area of each sub-pixel area corresponding to a B portion of FIG. 4. FIG. 12 is a schematic diagram showing a light-emission area of each sub-pixel area corresponding to a C portion in FIG. 4.

As shown in FIG. 11 and FIG. 12, in the outwardly-bent shaped display device 10, the light-emission direction from each sub-pixel area SPA disposed at one side edge portion of the display panel 100 faces toward the central point of the view area 20. To change this direction, the light-emission face of each light-transmitting pattern 210 is not parallel to each sub-pixel area SPA, but is inclined toward the central point of the viewing area 20. That is, a virtual line connecting each sub-pixel area SPA and a central point of the light-emission face of each light-transmitting pattern 210 to each other is inclined toward the central point of the viewing area 20 relative to the light-emission direction from each sub-pixel area SPA.

Accordingly, in each of the display devices 10 and 10' according to the embodiments of the present disclosure, a position condition of the light-transmitting pattern 210 may be derived as follows.

Figure 13:
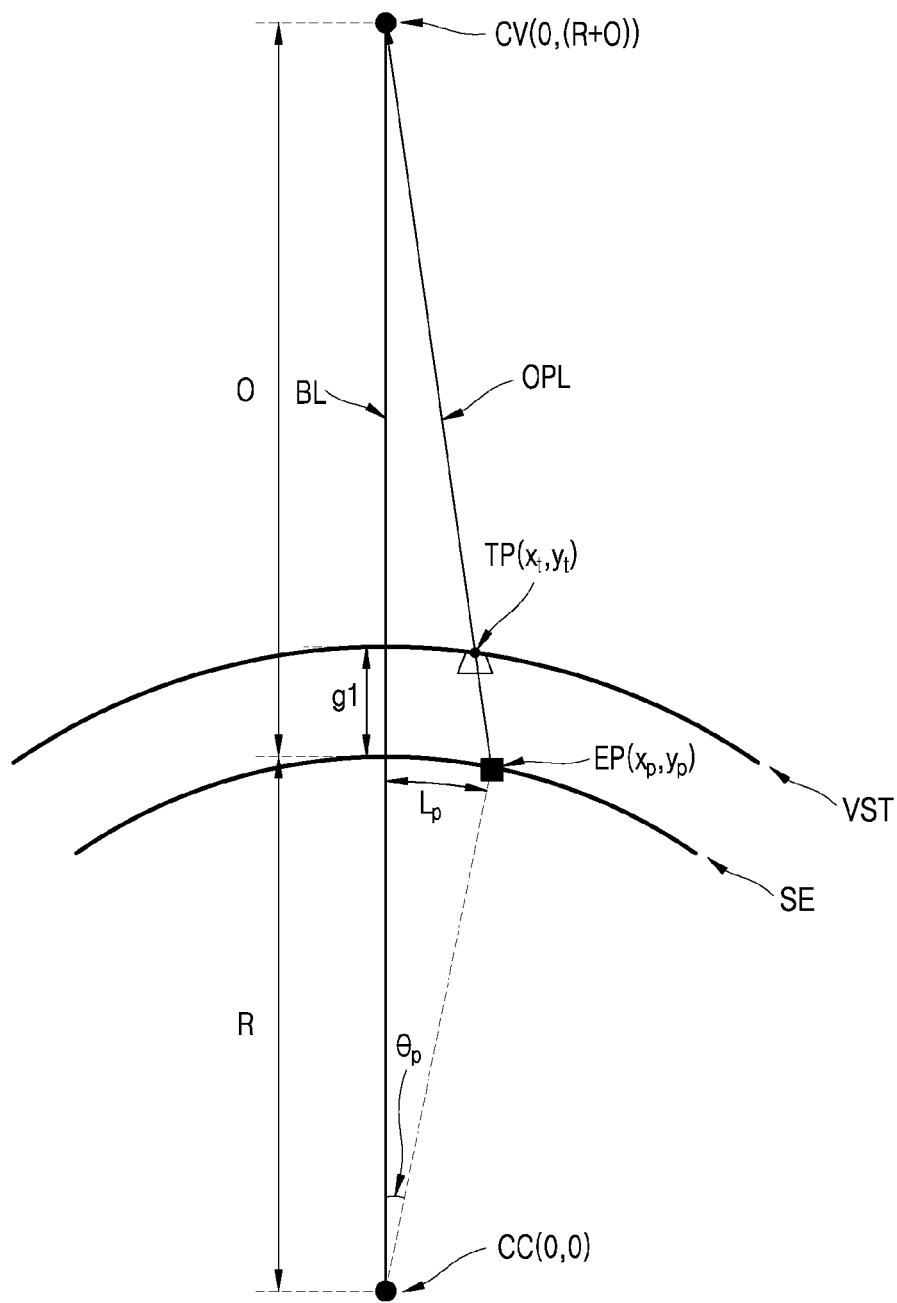
FIG. 13 is a schematic diagram of a position of one light-transmitting pattern in the display devices of FIGS. 3 and 6.

FIG. 13 is a schematic diagram of a position of one light-transmitting pattern in the display devices of FIGS. 3 and 6.

FIG. 13 shows an example of a coordinate system in which a center of curvature CC of the bent shape in each of the outwardly-bent shaped display devices 10 and 10' shown in FIGS. 2 and 4 is assumed as a reference point (0 and 0).

Moreover, the radius of curvature of the bent shaped display panel 100 is assumed as R (Radius of panel). An optimum viewing distance corresponding to the viewing area 20 in FIG. 1 is assumed to be O. Further, a central point CV (Center of Viewing) of the viewing area 20 is assumed to be located at a coordinate (0, R+O).

FIG. 13 shows a light emission face SE (Surface of Emitting device) corresponding to the light-emissive array 130 composed of a plurality of light-emissive elements (ED in FIG. 9) that emit light corresponding to the plurality of sub-pixel areas SPA of the outwardly-bent shaped display panel 100, and a virtual face VST corresponding to the light-emission face of each of the plurality of light-transmitting patterns 210 included in the outwardly-bent shaped light travel-direction changing layer 200. Due to a thickness of the sealing film (140 in FIG. 9) of the display panel 100 and a thickness of the light-transmitting pattern (210 in FIG. 9), the light-emission face SE and the virtual face VST are spaced from each other by a predefined first spacing g1.

As mentioned above, in each of the display devices 10 and 10' according to the embodiments of the present disclosure, a central point TP (Transmission Point) $(x_t, y_t)$ of the light-emission face of each light-transmitting pattern 210 corresponds to an optimal light-path line OPL connecting a sub-pixel area EP (Emitting Point) $(x_p, y_p)$ corresponding to each light-transmitting pattern 210 and the central point CV of the viewing area 20 to each other.

That is, the central point TP $(x_t, y_t)$ of the light-emission face of each of the plurality of light-transmitting patterns 210 corresponds to a point at which the optimal light-path line OPL connecting a sub-pixel area EP (Emitting Point) $(x_p, y_p)$ corresponding to each light-transmitting pattern 210 and the central point CV of the viewing area 20 to each other contacts the virtual face VST corresponding to the light-emission face of each of the plurality of light-transmitting patterns 210.

In other words, at the central point TP $(x_t, y_t)$ of the light-emission face of one light-transmitting pattern 210 positioned at the virtual face VST, the optimal light-path line OPL of one sub-pixel area EP (Emitting Point) $(x_p, y_p)$ corresponding to one light-transmitting pattern 210 contacts the virtual face VST.

Thus, light from each sub-pixel area SPA may emit along the optimal light-path line OPL toward the central point CV of the viewing area 20 through the light-transmitting pattern 210. Thus, the display quality in the viewing area 20 may be improved.

Specifically, in the coordinate system (x, y) in which the center of curvature CC of the bent shape is the reference point (0, 0), the optimal light-path line OPL passing through the central point TP $(x_t, y_t)$ of the light-emission face of one light-transmitting pattern 210 may be defined based on an equation of a line as expressed in Equation 1 below.

$$y=mx+(R+O) \qquad \text{[Equation 1]}$$

In Equation 1, m denotes a slope of the optimal light-path line OPL of one sub-pixel area EP $(x_p, y_p)$ corresponding to one light-transmitting pattern 210 in the coordinate system (x, y) in which the center of curvature CC of the bent shape is the reference point (0, 0).

As expressed as Equation 1, in the coordinate system (x, y) in which the center of curvature CC of the bent shape is the reference point (0, 0), a position TP $(x_t, y_t)$ of the central point of the light-emission face of each light-transmitting pattern 210 may be derived based on the slope m of the optimal light-path line OPL, the radius of curvature R of the bent shape, and the optimum viewing distance O.

The slope m of the optimal light-path line OPL of each sub-pixel area EP $(x_p, y_p)$ may be derived based on Equation 2 below.

$$m = \frac{y_p - (R+O)}{x_p} \qquad \text{[Equation 2]}$$

That is, as expressed in Equation 2, in the coordinate system (x, y) in which the center of curvature CC of the bent shape is the reference point (0, 0), the slope m of the optimal light-path line OPL of each sub-pixel area EP $(x_p, y_p)$ may be derived based on the position EP $(x_p, y_p)$ of each sub-pixel area in the coordinate system (x, y) in which the center of curvature CC of the bent shape is the reference point (0, 0), the radius of curvature R of the bent shape, and the optimum viewing distance O.

In addition, in the coordinate system (x, y) in which the center of curvature CC of the bent shape is the reference point (0, 0), the virtual face VST corresponding to the light-emission face of each of the plurality of light-transmitting patterns 210 may be derived based on an equation of a circle as expressed in Equation 3 below.

$$x^2+y^2=(R-g1)^2 \qquad \text{[Equation 3]}$$

Therefore, when combining Equations 1, 2 and 3, a position TP $(x_t, y_t)$ of the central point of the light-emission face of each light-transmitting pattern 210 in the coordinate system (x, y) in which the center of curvature CC of the bent shape is the reference point (0, 0) may be derived based on following Equation 4 and Equation 5.

$$x = \frac{\sqrt{m^2(g1+R)^2 + (g1-O)(g1+O+2R)} - m(R+O)}{m^2+1} \qquad \text{[Equation 4]}$$

$$y = mx + (R+O) \qquad \text{[Equation 5]}$$

That is, as expressed in Equation 4 and Equation 5, the position TP $(x_t, y_t)$ of the central point of the light-emission face of each light-transmitting pattern 210 in the coordinate system (x, y) in which the center of curvature CC of the bent shape is the reference point (0, 0) may be derived based on the slope m of the optimal light-path line OPL of each sub-pixel area SPA corresponding to each light-transmitting pattern 210, the spacing g1 between the virtual face VST and the light-emission face SE, the radius of curvature R of the bent shape, and the optimum viewing distance O.

Moreover, in order to derive a position EP $(x_p, y_p)$ of each sub-pixel area in the coordinate system (x, y) in which the center of curvature CC of the bent shape is the reference point (0, 0), a spacing length $L_p$ along the light-emission face SE between a base line BL connecting the center of curvature CC of the bent shape and the central point CV of the viewing area 20 to each other and each sub-pixel area EP is used.

In this connection, the spacing length $L_p$ along the light-emission face SE between the base line BL connecting the center of curvature CC of the bent shape and the central point CV of the viewing area 20 to each other and each sub-pixel area EP may be derived based on an equation for obtaining an arc length. For reference, in a following description, a unit of an angle is radian.

Accordingly, as expressed in Equation 6 below, an angle $\theta_p$ between a connection line connecting each sub-pixel area EP ($x_p$, $y_p$) and the center of curvature CC of the bent shape to each other and the base line BL may be derived based on the spacing length $L_p$ and the radius of curvature R of the bent shape.

$$\theta_p = \frac{L_p}{R} \quad \text{[Equation 6]}$$

Moreover, the position EP ($x_p$, $y_p$) of each sub-pixel area in the coordinate system (x, y) in which the center of curvature CC of the bent shape is the reference point (0, 0) may be derived based on the angle $\theta_p$ between the connection line connecting each sub-pixel area EP ($x_p$, $y_p$) and the center of curvature CC of the bent shape to each other and the base line BL, and the radius of curvature R of the bent shape.

As described above, according to each of the embodiments of the present disclosure, the position TP ($x_t$, $y_t$) of the central point of the light-emission face of each light-transmitting pattern 210 may correspond to the optimal light-path line OPL of each sub-pixel area SPA corresponding to each light-transmitting pattern 210. As a result, the light from each sub-pixel area SPA emits through the light-transmitting pattern 210, and is directed toward the viewing area 20 along the optimal light-path line OPL. Thus, the display quality in the viewing area 30 may be improved.

In one example, each of the display devices 10 and 10' according to each embodiment of the present disclosure may be prepared by deforming the display panel 100 and the light travel-direction changing layer 200 from a planar shape into a bent shape.

In this connection, each of the display panel 100 and the light travel-direction changing layer 200 may have a bending stress due to the bent shape. Thus, the position of the light-transmitting pattern of the light travel-direction changing layer 200 may be changed due to the bending stress.

Figure 14:
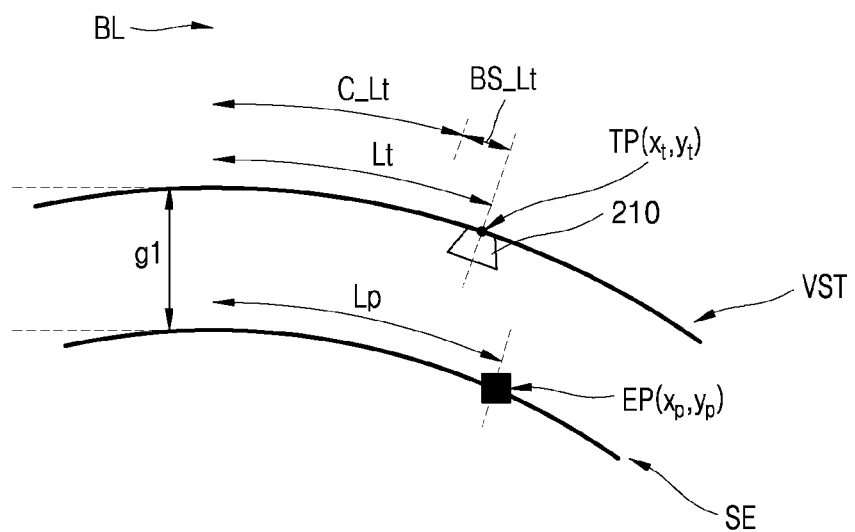
FIG. 14 is a schematic diagram of a position variation of a light-transmitting pattern according to deformation in the display devices of FIGS. 3 and 6.

FIG. 14 is a schematic diagram of the position variation of the light-transmitting pattern according to the deformation in each of the display devices of FIGS. 3 and 6.

As shown in FIG. 14, when the light travel-direction changing layer 200 is deformed from the planar shape to the bent shape, the bending stress may cause the position of the central point of the light-emission face of the light-transmitting pattern 210 to change to be further spaced away from the base line BL.

That is, a spacing length $L_t$ between the central point TP ($x_t$, $y_t$) of the light-emission face of each light-transmitting pattern 210 on the virtual face VST of the bent shape and the base line BL may be derived as a sum of a spacing length C_$L_t$ between the base line BL and a planar virtual face VST, and a length BS_$L_t$ by which the central point TP ($x_t$, $y_t$) is displaced due to the bending stress.

Therefore, when deriving the position of each light-transmitting pattern 210 for mutual alignment between the planar display panel 100 and the planar light travel-direction changing layer 200, a correction value based on the position variation of the light-transmitting pattern 210 according to the bending stress should be derived.

Figure 15:
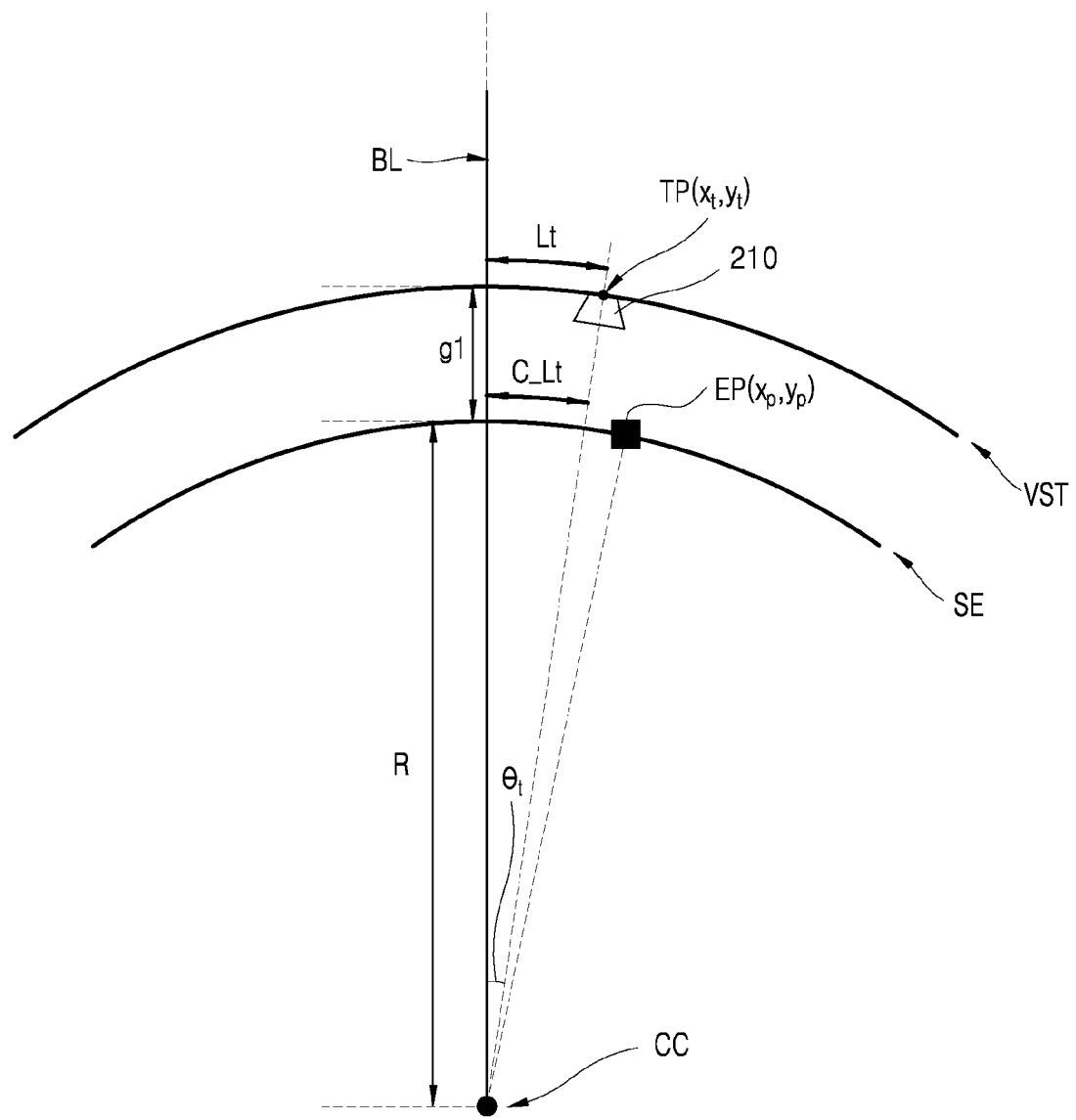
FIG. 15 is a schematic diagram of a position correction of a light-transmitting pattern according to a bent shape in the display devices of FIGS. 3 and 6.

FIG. 15 is a schematic diagram of the position correction of the light-transmitting pattern according to the bent shape in each of the display devices of FIGS. 3 and 6.

As shown in FIG. 15, the spacing length C_$L_t$ between the central point TP ($x_t$, $y_t$) of the light-emission face of each light-transmitting pattern 210 on the planar virtual face VST and the base line BL may be derived based on the light-emission face SE.

That is, as expressed in Equation 7 below, an angle $\theta_t$ between the connection line connecting the central point TP ($x_t$, $y_t$) of the light-emission face of each light-transmitting pattern 210 and the center of curvature CC of the bent shape to each other and the base line BL may be derived based on the coordinate TP ($x_t$, $y_t$) of the central point of the light-emission face of each light-transmitting pattern 210 in the coordinate system (x, y) in which the center of curvature CC of the bent shape is the reference point (0, 0).

$$\theta_t = \tan^{-1}\left(\frac{x_t}{y_t}\right) \quad \text{[Equation 7]}$$

Moreover, as expressed as Equation 8 below, the spacing length $L_t$ between the central point TP ($x_t$, $y_t$) of the light-emission face of each light-transmitting pattern 210 on the virtual face VST of the bent shape and the base line BL may be derived based on the radius R of curvature of the bent shape.

$$L_t = (R + g1)\theta_t \quad \text{[Equation 8]}$$

The spacing length C_$L_t$ between the central point TP ($x_t$, $y_t$) of the light-emission face of each light-transmitting pattern 210 on the planar virtual face VST and the base line BL may correspond to a position on the light-emission face SE onto which the central point is projected. Thus, as expressed in Equation 9 below, the spacing length C_$L_t$ may be derived based on the angle $\theta_t$ between the connection line connecting the central point TP ($x_t$, $y_t$) of the light-emission face of each light-transmitting pattern 210 to the center of the curvature CC of the bent shape and the base line BL, and the radius of curvature R of the bent shape.

$$C\_L_t = \frac{R}{(R+g1)}\theta_t = R\theta_t \quad \text{[Equation 9]}$$

Next, a condition for a width of each of a light-emission face and a light incident face of the light-transmitting pattern 210 according to each embodiment of the present disclosure will be described.

Figure 16:
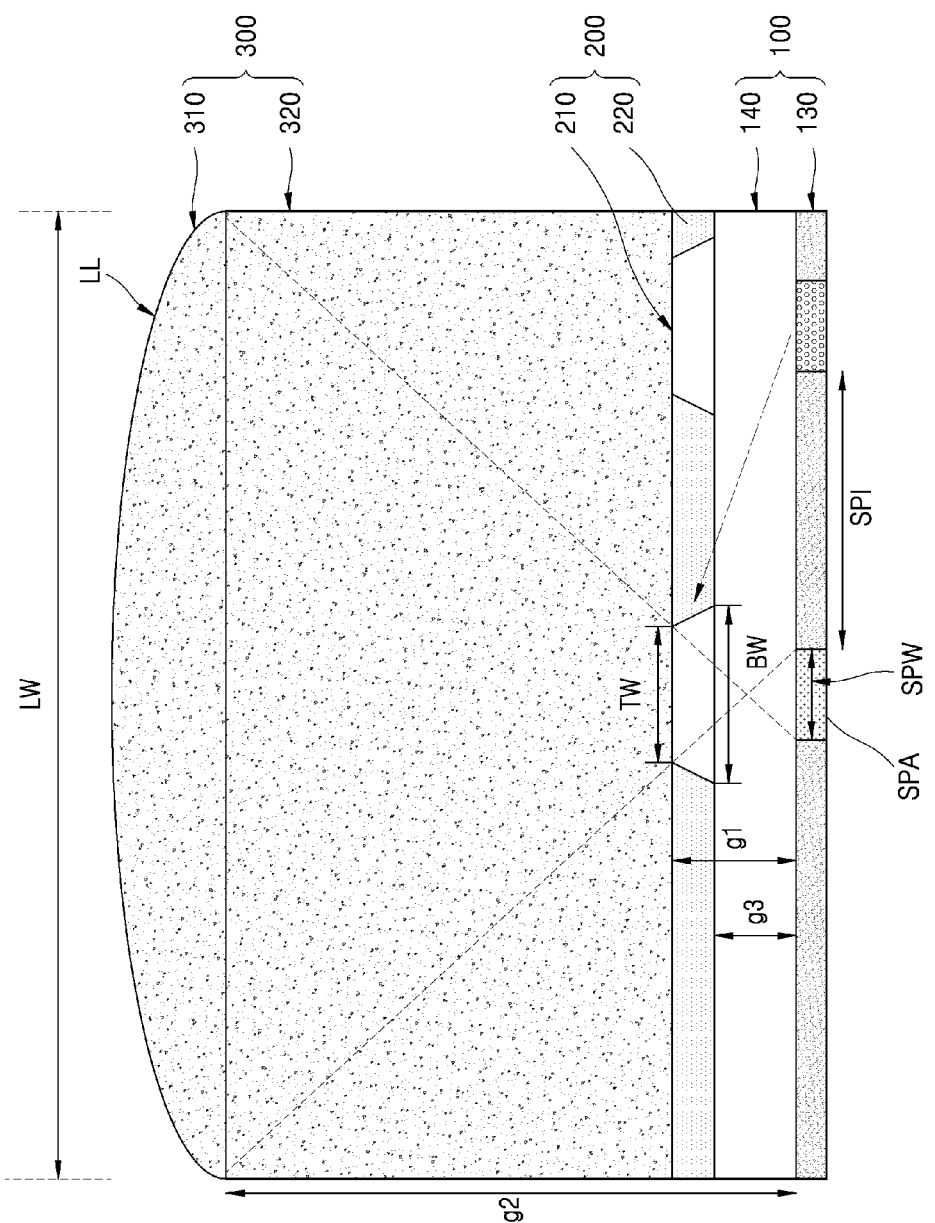
FIG. 16 is a schematic diagram of a width of a light-transmitting pattern in the display devices of FIGS. 3 and 6.

FIG. 16 is a schematic diagram of a width of the light-transmitting pattern in each of the display devices of FIGS. 3 and 6.

As shown in FIG. 16 and expressed by a following Equation 10, a width TW of the light-emission face of each light-transmitting pattern 210 may be derived based on a ratio between a width SPW of each sub-pixel area SPA and a width LW of a target lenticular lens LL corresponding to each sub-pixel area SPA, the first spacing g1 between the light-emissive array 130 and the light-emission face of the light-transmitting pattern 210, and a second spacing g2 between the light-emissive array 130 and the lens layer 310.

$$TW = (LW + SPW)\frac{g_1}{g_2} - SPW \quad \text{[Equation 10]}$$

Moreover, as shown in FIG. 16, the light incident face of each light-transmitting pattern 210 facing toward each sub-pixel area SPA may be opposite to the light-emission face and may have a width larger than that of the light-emission face. That is, the light-transmitting pattern 210 may be formed to have a trapezoidal cross section in which each of both opposing side faces is inclined downwardly and outwardly. In this way, there is an advantage in that most of an amount of light from each sub-pixel area SPA may be easily incident to the light-transmitting pattern 210.

However, a width BW of the light incident face of each light-transmitting pattern 210 should be sized such that light from each sub-pixel area SPA corresponding to each light-transmitting pattern 210 will not be incident on a sub-pixel area SPA other than the sub-pixel area SPA corresponding to each light-transmitting pattern 210.

Accordingly, as shown in FIG. 16 and expressed by Equation 11 below, the width BW of the light incident face of each light-transmitting pattern 210 may be derived based on a spacing SPI (sub-pixel interval) between adjacent sub-pixel areas SPA, the first spacing g1, and a third spacing g3 between the light-emissive array 130 and the light incident face of the light-transmitting pattern 210.

$$BW = (g_1 - g_3)\frac{SPI}{g_1} \quad \text{[Equation 11]}$$

In one example, as the display panel 100 and the light travel-direction changing layer 200 are formed in the bent shape, the light incident face of each light-transmitting pattern 210 may overlap only a portion of the sub-pixel area SPA corresponding to each light-transmitting pattern 210, or may not overlap with the sub-pixel area SPA corresponding to each light-transmitting pattern 210. Therefore, a portion of the light from each sub-pixel area SPA may be blocked by the light-blocking pattern 220. Thus, a luminance level at an edge portion of each of the display devices 10 and 10' having the outwardly-bent shape may be lowered.

To prevent this situation, a condition about an internal angle of each light-transmitting pattern 210 may be derived.

Figure 17:
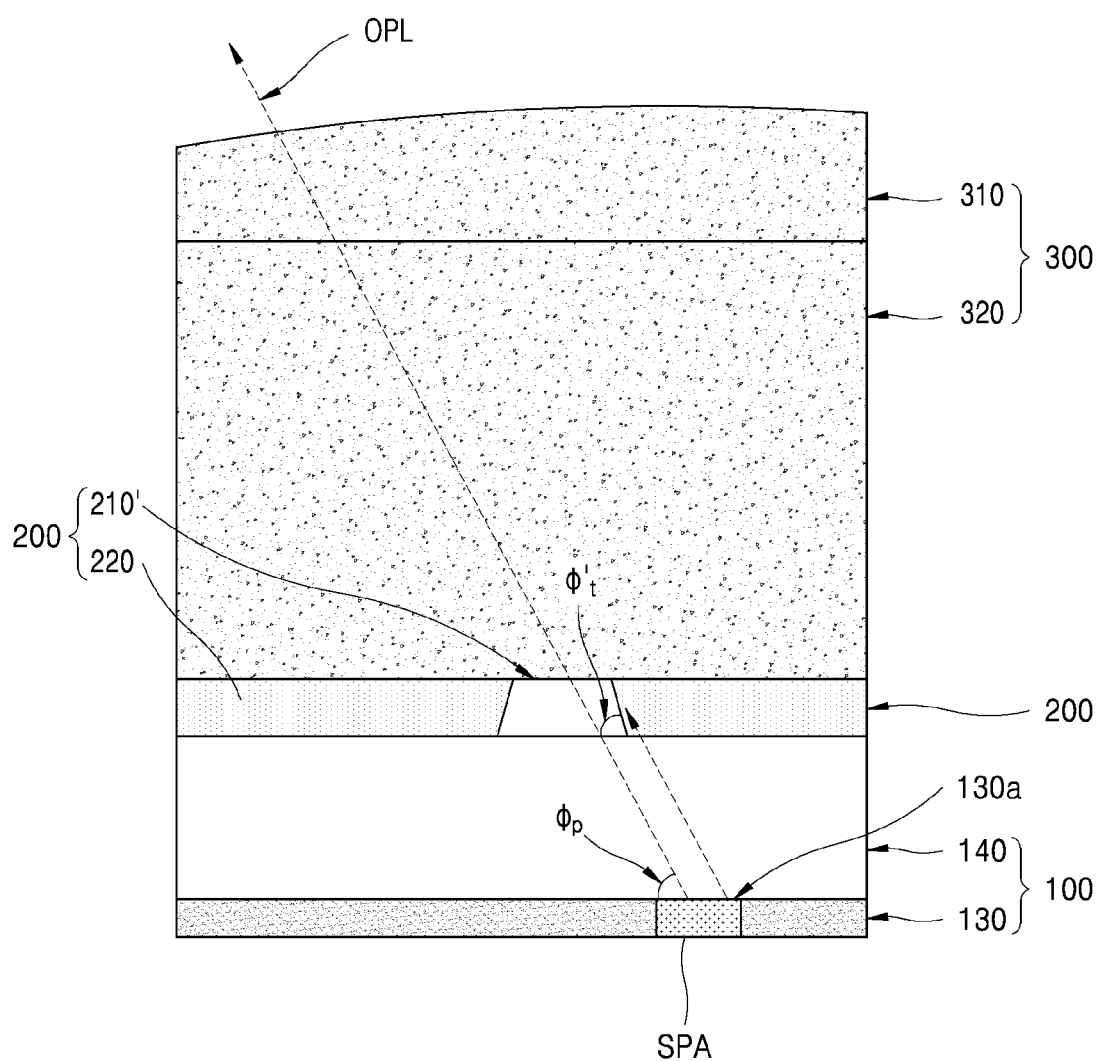
FIG. 17 is a drawing showing a comparative example of an internal angle of a light-transmitting pattern.

FIG. 17 is a drawing showing a comparative example of the internal angle of the light-transmitting pattern.

As shown in the comparative example REF shown in FIG. 17, as the width (BW of FIG. 16) of the light incident face of each light-transmitting pattern 210' is larger than the width (TW in FIG. 16) of the light emission face of each light-transmitting pattern 210', an internal angle $\varphi'_t$ between the light incident face and a side face between the light incident face and the light emission face becomes smaller.

In other words, the larger the internal angle $\varphi'_t$ between the side face and the light incident face, the smaller the width BW of the light incident face. Thus, a possibility that the light from the sub-pixel area SPA is incident on the light-transmitting pattern 210' is reduced.

In particular, in the outwardly-bent shaped display panel 100, as each sub-pixel area SPA is disposed more adjacent to each of both opposing edge portions of the bent shape, an angle $\varphi_p$ between the optimal light-path line OPL corresponding to the central point of the viewing area (CV in FIG. 13) and a tangent line TL (FIG. 18) against the light-emission face 130a (SE in FIG. 13) at the point ($x_p$, $y_p$) becomes smaller. Accordingly, an overlapping area between the sub-pixel area SPA and the light-transmitting pattern 210' corresponding to each other may be reduced. In this connection, as the internal angle $\varphi'_t$ of the light-transmitting pattern 210' increases, an amount of a portion of the light from the sub-pixel area SPA reaching the light-blocking pattern 220 increases. Thus, the luminance at each of both opposing edge portions may be lowered.

To prevent this situation, according to each embodiment of the present disclosure, the internal angle $\varphi'_t$ of each light-transmitting pattern 210' may be smaller than the angle $\varphi_p$ between the optimal light-path line OPL corresponding to the central point of the viewing area (CV in FIG. 13) and the tangent line TL (FIG. 18) of the light-emission face 130a (SE in FIG. 13).

Figure 18:
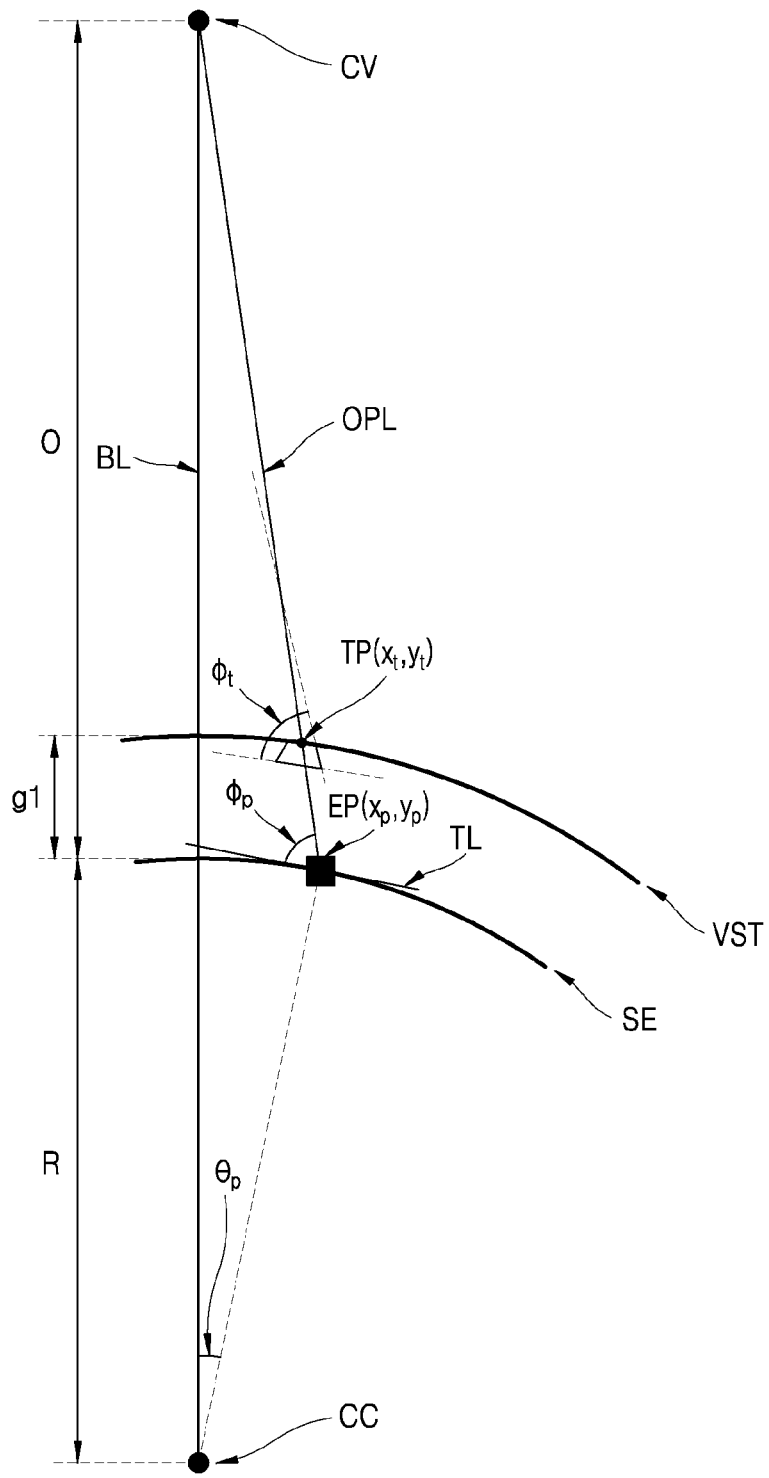
FIG. 18 is a schematic diagram of an internal angle of a light-transmitting pattern in the display devices of FIGS. 3 and 6.

FIG. 18 is a schematic diagram of the internal angle of the light-transmitting pattern in each of the display devices of FIGS. 3 and 6.

As shown in FIG. 18, according to each embodiment of the present disclosure, the internal angle $\varphi_t$ between the light incident face and a side face between the light incident face and the light emission face of each light-transmitting pattern TP is smaller than the angle $\varphi_p$ between the optimal light-path line OPL corresponding to the central point of the viewing area (CV in FIG. 13) and the tangent line TL against the light-emission face 130 (SE in FIG. 13) ($\varphi t < \varphi p$).

In this way, the light-transmitting pattern (TP) (210' in FIG. 17) corresponding to each sub-pixel area SPA may be deformed based on the position EP of each sub-pixel area SPA in the bent shape. Thus, the light from each sub-pixel area SPA may be relatively easily incident onto the light-transmitting pattern (TP) (210' in FIG. 17). Therefore, the luminance reduction due to the bent shape may be prevented.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:
1. A display device comprising:
    a curved display panel including a plurality of sub-pixel areas configured to output light toward a predefined viewing area to display an image; and
    a light travel-direction changing layer disposed on the display panel, the light travel-direction changing layer configured to change a travel direction of the light emitted from each of the plurality of sub-pixel areas toward the predefined viewing area,
    wherein the light travel-direction changing layer includes:
        a plurality of light-transmitting patterns arranged in a matrix form, each light-transmitting pattern corresponding to one of the plurality of sub-pixel areas and including a light-emission face that emits the light supplied by the corresponding one of the plurality of sub-pixels towards the predefined viewing area; and a light-blocking pattern disposed between the plurality of light-transmitting patterns, the light-blocking pattern configured to block light emitted by the plurality of sub-pixel areas; and wherein a central point of a light-emission face of a light-transmitting pattern from the plurality of light-transmitting patterns is offset from a center point of a sub-pixel area from the plurality of sub-pixel areas that corresponds to the light-transmitting pattern, and an optimal light-path line connects the center point of the sub-pixel area, the center point of the light-emission face of the light-transmitting pattern, and a central point of the viewing area to each other.

2. The device of claim 1, wherein the display panel includes a light-emissive array for emitting light corresponding to each of the plurality of sub-pixel areas, wherein each of the display panel and the light travel-direction changing layer has a curved shape, and wherein a position of the central point of the light-emission face of the light-transmitting pattern in a coordinate system in which a center of curvature of the curved shape is defined as a reference point is determined based on:

a center of curvature of the curved shape,
a slope of the optimal light-path line,
a spacing between the light-emission face of the light-transmitting pattern and a corresponding sub-pixel area,
a radius of curvature of the curved shape, and
an optimum viewing distance as a spacing between the viewing area and the light-emission face.

3. The device of claim 2, wherein a position on the light-emission face of the light-transmitting pattern corresponding to the central point of the corresponding sub-pixel area is determined based on:

the radius of curvature of the curved shape, and
a spacing between the light-emission face of the light-transmitting pattern and the corresponding sub-pixel area.

4. The device of claim 2, wherein a position on the optimal light-path line of the central point of the light-emission face of the light-transmitting patterns is derived based on:

a slope of the optimal light-path line,
the radius of curvature of the curved shape, and
the optimum viewing distance.

5. The device of claim 4, wherein the direction of the optimal light-path line is derived based on:

a position of each sub-pixel area in a coordinate system in which the center of curvature of the curved shape is defined as a reference point,
the radius of curvature of the curved shape, and
the optimum viewing distance.

6. The device of claim 5, wherein the position of each sub-pixel area in a coordinate system in which the center of curvature of the curved shape is defined as a reference point is determined based on:

a spacing length between a contact point on the light-emission face and the corresponding sub-pixel area, wherein a base line connecting the center of curvature of the curved shape and the central point of the viewing area to each other passes through the contact point on the light-emission face, and
the radius of curvature of the curved shape.

7. The device of claim 2, wherein a first portion of the display panel and a first portion of the light travel-direction changing layer are aligned with each other in a planar shape, and a second portion of the display panel and a second portion of the light travel-direction changing layer are deformed into a curved shape, a spacing length between the central point of the light-emission face of the light-transmitting pattern and a central point of the corresponding sub-pixel area and a base line connecting the center of curvature of the curved shape and the central point of the viewing area is determined based on:

an angle between the base line and a connection line, wherein the connection line connects the center of curvature of the curved shape and the central point of the light-emission face of the light-transmitting patterns, and
the radius of curvature of the curved shape.

8. The device of claim 7, wherein the angle between the base line and the connection line is determined based on a position of the central point of the light-emission face of the light-transmitting patterns in a coordinate system in which the center of curvature of the curved shape is defined as a reference point.

9. The device of claim 3, wherein the device further comprises a lens array disposed on the light travel-direction changing layer, wherein the lens array includes:
a lens layer including a plurality of lenticular lenses arranged in a matrix form; and
a spacer layer for spacing the lens layer and the light travel-direction changing layer from each other, and
wherein light-emission faces of the plurality of light-transmitting patterns face toward the lens array.

10. The device of claim 9, wherein at least two sub-pixel areas arranged in a line among the plurality of sub-pixel areas correspond to one target lenticular lens among the plurality of lenticular lenses.

11. The device of claim 10, wherein a width of the light-emission face of one light-transmitting pattern among the plurality of light-transmitting patterns is derived based on:

a width of one sub-pixel area corresponding to the one light-transmitting pattern,
a width of a target lenticular lens corresponding to one sub-pixel area,
a spacing between the light-emissive array and a light-emission face of the one light-transmitting pattern, and
a spacing between the light-emissive array and the lens layer.

12. The device of claim 1, wherein a light incident face of the light-transmitting patterns facing toward each sub-pixel area is opposite to the light-emission face and has a larger width than a width of the light-emission face.

13. The device of claim 12, wherein the width of the light incident face of the light-transmitting patterns is derived based on:

a spacing between each sub-pixel area and the light-emission face of the light-transmitting patterns,
a spacing between each sub-pixel area and the light incident face of the light-transmitting patterns, and
a spacing between adjacent sub-pixel areas.

14. The device of claim 12, wherein an internal angle between the light incident face of the light-transmitting patterns and a side face connecting the light incident face and the light-emission face of the light-transmitting patterns to each other is smaller than an angle between the optimal light-path line of each sub-pixel area and a tangent line against the light-emission face at the central point of the light-emission face.

15. The device of claim 14, wherein the display panel and the light travel-direction changing layer has a curved shape convexly curved toward the viewing area,
  wherein as each sub-pixel area is disposed more adjacent to each of both opposing edges of the display panel along a bending direction of the curved shape, the angle between the optimal light-path line of each sub-pixel area and the tangent line is smaller.

16. The device of claim 2, wherein the display panel and the light travel-direction changing layer has a curved shape convexly curved toward the viewing area.

* * * * *